(12) United States Patent
Walker et al.

(10) Patent No.: US 12,263,646 B2
(45) Date of Patent: Apr. 1, 2025

(54) DEVICES, SYSTEMS, AND METHODS FOR MULTI-PROJECTOR THREE DIMENSIONAL PRINTING

(71) Applicant: AZUL 3D, INC., Skokie, IL (US)

(72) Inventors: David Walker, Skokie, IL (US); Michael Flynn, Skokie, IL (US); Jay Valdillez, Skokie, IL (US)

(73) Assignee: Azul 3D, Inc., Skokie, IL (US)

( * ) Notice: Subject to any disclaimer, the term of this patent is extended or adjusted under 35 U.S.C. 154(b) by 0 days.

(21) Appl. No.: 17/898,634

(22) Filed: Aug. 30, 2022

(65) Prior Publication Data

US 2022/0410491 A1 Dec. 29, 2022

Related U.S. Application Data

(62) Division of application No. 16/835,182, filed on Mar. 30, 2020, now Pat. No. 11,472,119.

(60) Provisional application No. 62/826,361, filed on Mar. 29, 2019.

(51) Int. Cl.
| | | |
|---|---|---|
| B29C 64/393 | (2017.01) | |
| B29C 64/282 | (2017.01) | |
| B33Y 10/00 | (2015.01) | |
| B33Y 30/00 | (2015.01) | |
| B33Y 50/02 | (2015.01) | |

(52) U.S. Cl.
CPC .......... *B29C 64/393* (2017.08); *B29C 64/282* (2017.08); *B33Y 10/00* (2014.12); *B33Y 30/00* (2014.12); *B33Y 50/02* (2014.12)

(58) Field of Classification Search
None
See application file for complete search history.

(56) References Cited

U.S. PATENT DOCUMENTS

| | | | |
|---|---|---|---|
| 2015/0051999 A1* | 2/2015 | Apsley | G06Q 10/0836 705/26.5 |
| 2015/0197064 A1 | 7/2015 | Walker et al. | |
| 2015/0248504 A1 | 9/2015 | Glunz et al. | |
| 2016/0257074 A1 | 9/2016 | Levine et al. | |
| 2018/0056585 A1* | 3/2018 | Du Toit | B29C 64/236 |
| 2018/0304539 A1 | 10/2018 | Ng et al. | |
| 2018/0370148 A1 | 12/2018 | Sekine et al. | |

(Continued)

FOREIGN PATENT DOCUMENTS

| | | |
|---|---|---|
| EP | 3829851 A1 | 6/2021 |
| JP | 2016-159630 | 9/2016 |
| JP | 2017-165093 A | 9/2017 |

(Continued)

OTHER PUBLICATIONS

Great Britian Examination Report corresponding to Application No. GB 2113605.6 dated Mar. 20, 2023.

(Continued)

*Primary Examiner* — Yung-Sheng M Tsui

(74) *Attorney, Agent, or Firm* — Barnes & Thornburg LLP

(57) ABSTRACT

Devices, systems, and/or methodologies are provided for three dimensional printing, for example, additive manufacturing, wherein an array of energy patterning (e.g., light patterning) modules are used in conjunction with an automated positional control system to coordinate implementation of patterning modules of the array. Implementation of the array can be controlled by a sensory feed-back.

20 Claims, 18 Drawing Sheets

(56) References Cited

U.S. PATENT DOCUMENTS

2020/0031051 A1    1/2020  Wynne

FOREIGN PATENT DOCUMENTS

WO            2016179661  A1    11/2016
WO     WO 2016/179661           11/2016
WO            2020028122  A1     2/2020

OTHER PUBLICATIONS

Examination Report issued in GB2113605.6 (Jul. 25, 2023).
1 Supplementary European Search Report for corresponding EP Application 20 78 3936 dated Nov. 2, 2022.
English translation of Office Action issued in Appl. No. JP 2021-560334 (Feb. 26, 2024).
Singapore Written Opinion corresponding to Singapore Application No. 11202110482S dated Oct. 25, 2023.
Exam Report issued in EP 20783936.6 (Apr. 4, 2024).
International Search Report and Written Opinion corresponding to PCT/US20/25838, dated Jun. 19, 2020.
Office Action in Japan Patent Application No. 2021-560334, dated Nov. 5, 2024 (English translation).

* cited by examiner

DEVICES, SYSTEMS, AND METHODS FOR MULTI-PROJECTOR THREE DIMENSIONAL PRINTING

CROSS-REFERENCE TO RELATED APPLICATIONS

This utility patent application is a divisional application of, and claims the benefit of priority to, U.S. Non-provisional application Ser. No. 16/835,182, filed on Mar. 30, 2020, entitled DEVICES, SYSTEMS, AND METHODS FOR MULTI-PROJECTOR THREE DIMENSIONAL PRINTING, which claims the benefit of priority to U.S. Provisional Patent Application No. 62/826,361, filed on Mar. 29, 2019, entitled METHOD AND SYSTEM FOR METHODOLOGIES AND HARDWARE FOR MULTI-PROJECTOR THREE DIMENSIONAL PRINTING, the contents of each of which are incorporated herein by reference, in their entireties.

SUMMARY

Disclosed embodiments relate to devices, systems, and methodologies for three dimensional printing, for example, additive manufacturing, which can include a StereoLithographic Approach (SLA) and/or Digital Light Patterning (DLP) for three dimensional printing.

In accordance with at least some disclosed embodiments, an array of energy patterning (e.g., light patterning) modules may be used in a 3D printing methodology.

In accordance with at least some disclosed embodiments, each patterning module may include a multi-axis, micro-positioning system operating in conjunction with an energy patterning system including a projector.

In accordance with at least some disclosed embodiments, the projection system and/or micro-positioner may participate in a feed-back control loop for automated alignment of the energy patterning system to generate a continuous display area.

In accordance with at least some disclosed embodiments, each patterning module may contain an on-board micro-computer which is responsible for receiving and distributing commands to the energy patterning system and/or the micro-positioning system from a local or remote host. The communication between the micro-computer and the host may be (i) wired or wireless, (ii) encrypted, and (iii) bi-directional.

In accordance with at least some disclosed embodiments, the micro-computer may receive commands/data which are sent to the patterning module to control energy output (both pattern and intensity) of the projection of the energy patterning system. The micro-positioner may receive commands/data which are used to adjust the location of the patterning module along with the projector within the patterning module.

BRIEF DESCRIPTION OF THE DRAWINGS

An exemplary embodiment is shown in the drawings and is explained in detail below with reference to the figures. In the drawings:

FIGS. 7-8 illustrate example of alignment operations aligning the field of view from two separate projectors with mounting that does not result in perfect alignment there between.

DETAILED DESCRIPTION

Figure 1:
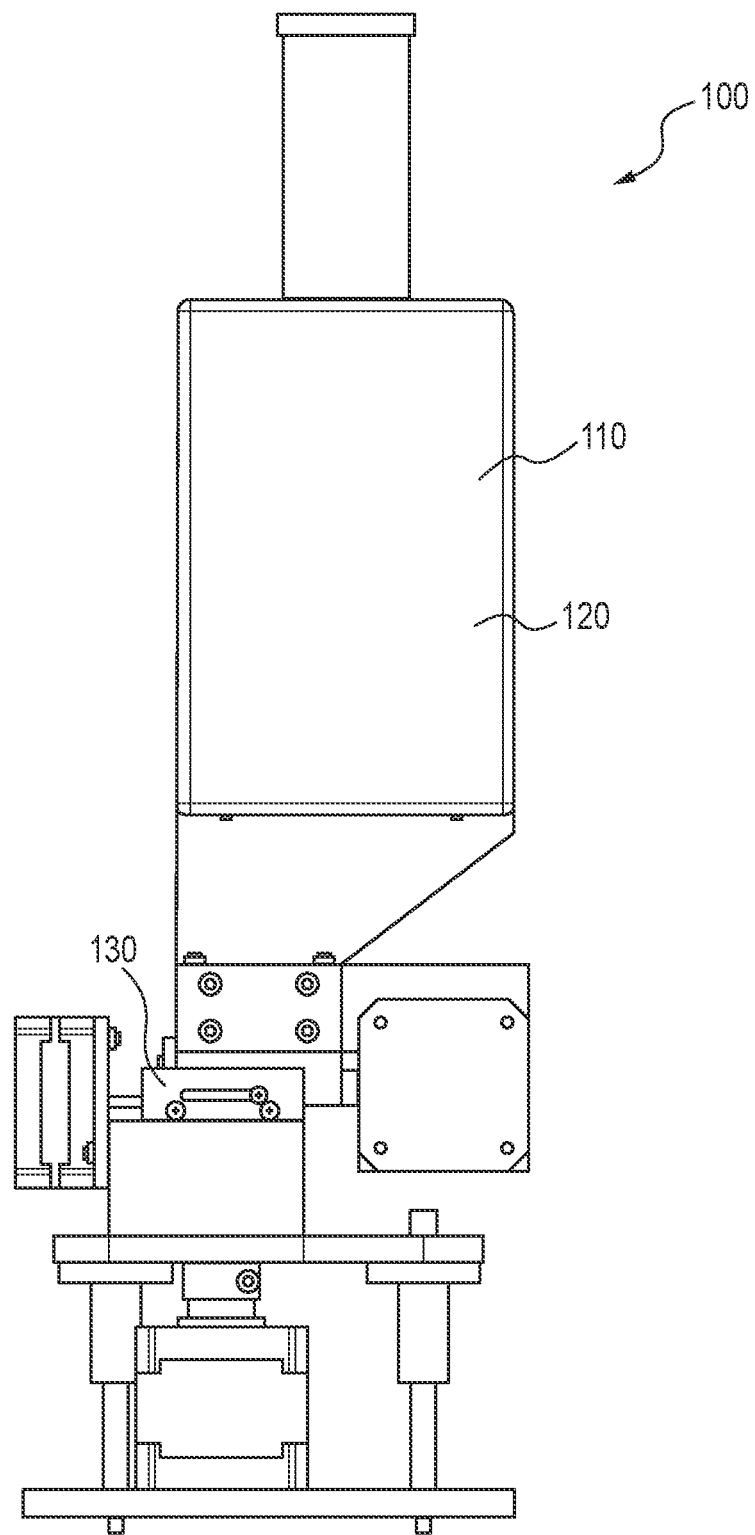
FIGS. 1-4 provide various views of an illustrative example of a patterning module designed in accordance with disclosed embodiments.
Figure 2:
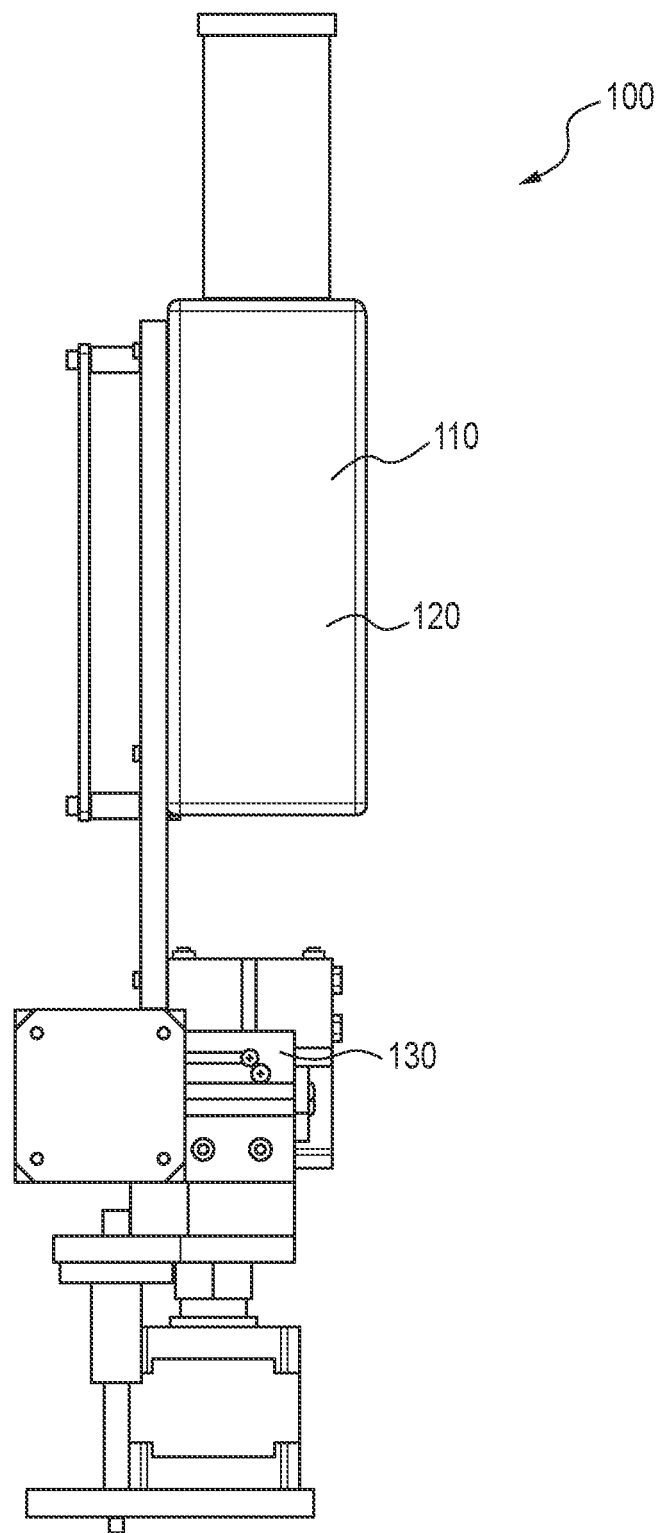
Figure 3:
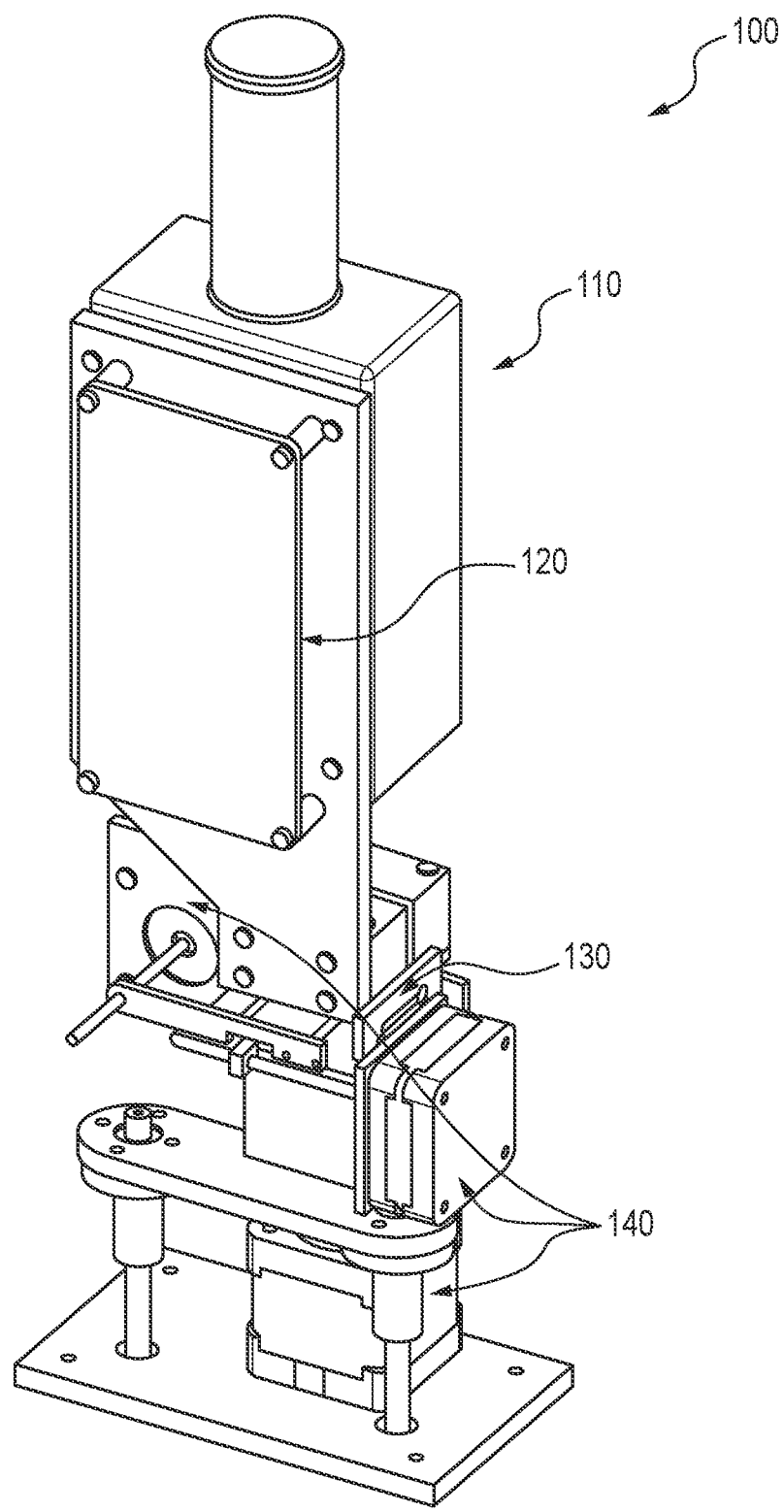
Figure 4:
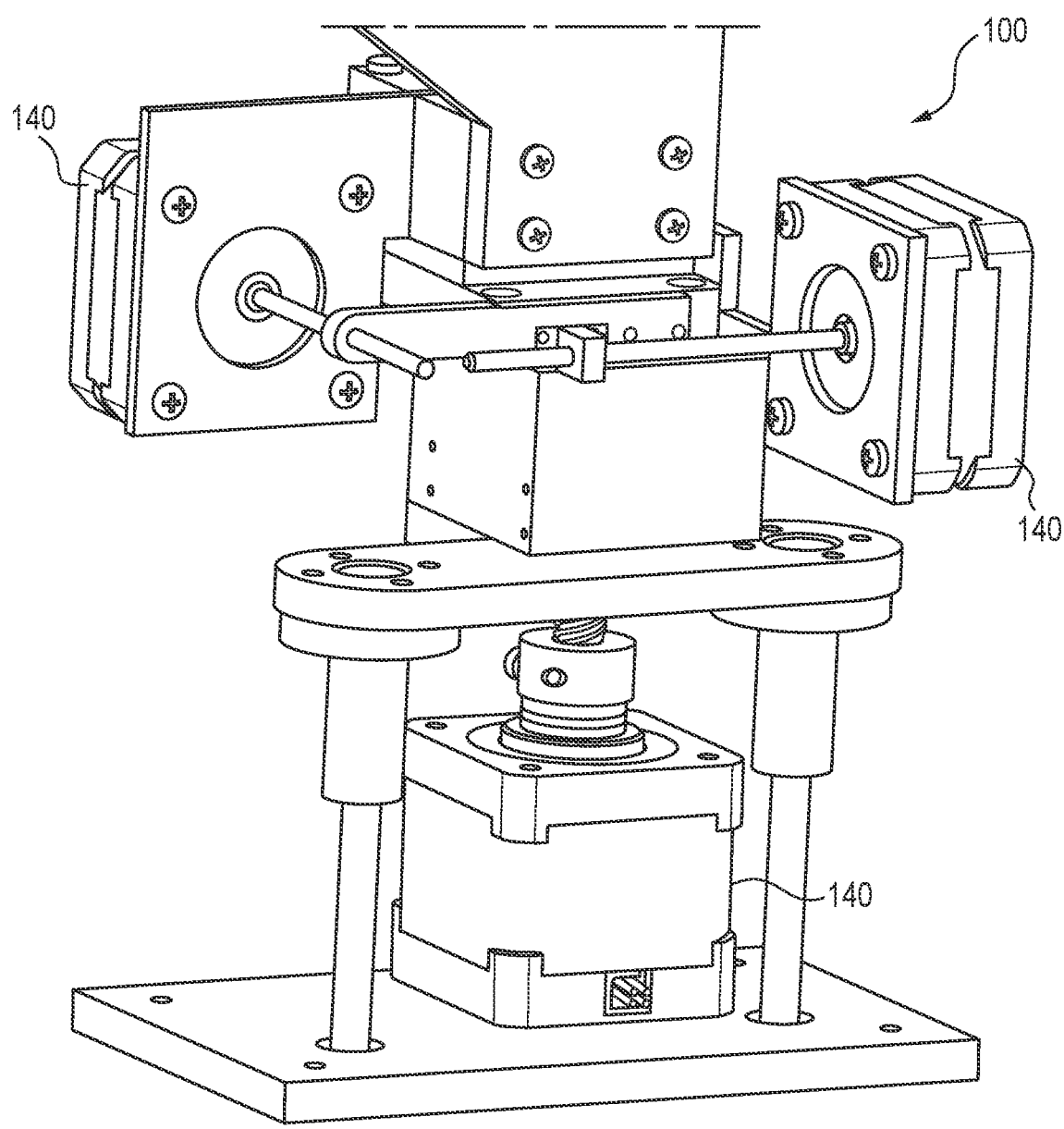

Conventionally, the StereoLithographic Approach (SLA) for additive manufacturing presents unique capabilities and technical opportunities over competing technologies. This is because SLA can deliver high print-speeds, while generating objects from a library of robust materials.

Central to the printing configuration for SLA, is the "light-engine," or projector, which is responsible for patterning light/energy to drive polymerization reactions of photo-sensitive liquid resins in the manufacturing process. The spectrum of light projected, power-density of the projected light, and the rate in which the light can be patterned all govern the capabilities of the additive manufacturing device, or printer, that utilizes the light engine.

For the purposes of this disclosure, the term "energy" is used to refer to energy measured in various forms including, but not limited to, radiated energy, for example light, both visible and not visible. Thus, it should be understood that, the application of "energy" is meant to include, and not be limited to the application of heat (thermal), light (radiant), electrical energy, magnetic energy, etc.

There exist two common routes to light/energy patterning in additive manufacturing devices. The first utilizes a laser beam, directed over a two-dimensional (2D) plane with a series of motorized mirrors (e.g., mirror galvanometers, also called "galvos", or resonance scanners), to trace out a 2D cross-sectional image of a net-shape to be printed. A Alternatively, Digital Light Processing (DLP) chips can be used in classical projector configurations to pattern microscopic pixels across the 2D plane, wherein, each pixel is updated on an internal clock frequency.

Ultimately, both light/energy patterning techniques have limitations regarding their ability to scale to larger 2D print beds.

In the case of the scanning laser beams, as the distance the beams span increases, there is a corresponding loss in lateral resolution of the beam cross section. This results in a corresponding loss of resolution in a printed object. Moreover, as a result of using a fixed scan speed, the increase size results in the 2D display frequency becoming quite slow; this limits the vertical print rate of any 3D printer configured using scanning laser beams.

In the case of the DLP based patterning technique, projection lenses may be used to cover a larger 2D area. However, the limited pixel density of conventionally available DLP chips in the market similarly limits the technical effect of this configuration. More specifically, with the limited pixel density, the projection over a larger area simply results in a larger projected pixel and a coarser 3D printed object.

An additional limitation of the DLP approach is that, when scaled to larger areas, there is a resulting limitation on projection power density. This is because, with less photons per unit area being delivered, the chemical reactions responsible for the print mechanism run slower and become a bottleneck in the print process. Conventional approaches to address this issue have included use of multiple projectors to cover a larger area. Such an approach has been used for decades by lighting specialists in the entertainment industry with both DLP and laser scanning systems. In this way, The projection area of each independent light engine can be stitched together to generate a large image. Indeed, conventionally, an array of light engines has been shown to be successful for performing 3D printing (for example, as disclosed in PCT Publication WO 2015200173).

However, in implementation, combining the effects of each independent light engine requires a methodology and equipment that enable tiling these projectors in an infinite means. Although mirrors can be used to easily tile two to four projectors into an array, beyond a certain point, the conventionally know use of mirrors becomes impractical, if not impossible, to scale.

Accordingly, new designs are required to tile a larger number of light patterning modules together. Presently disclosed embodiments provide hardware and software implemented systems that enable automatic alignment and stitching together of micro-patterning modules (i.e., pixel sizes below 500 μm) with high lateral precision.

It should be understood that, while disclosed embodiments enable technical utility to tile DLP based micro-projectors for SLA printing applications (together, referred to, herein, as "DLP-SLA" printing applications), the hardware and techniques described herein also have technical utility in application to other forms of 3D printing, in which multiple energy patterning modules may be used.

For example, the innovations disclosed herein have particular utility for application to Selective Laser (SL) SLA (often called SL-SLA), or Selective Laser Sintering (SLS), in which multiple laser modules might be tiled so as to cover a larger area with enhanced resolution.

It should also be understood that the hardware and corresponding software described herein are unique in both technical structure and functionality from those used in conventional entertainment applications, in which the 2D projection plane is often substantially larger than the hardware footprint by an order of magnitude (for example, a theatrical performance stage, movie viewing screen, building façade, etc.).

Rather, in the technological and industrial manufacturing context of 3D printing, often, the 2D projection plane is smaller than the footprint of the projection/patterning hardware. Thus, disclosed embodiments utilize miniaturized projection hardware and corresponding alignment systems for such hardware to conform the system to a footprint smaller than a desired projection domain.

Such an implementation enables the ability to more effectively scale to larger 2D print beds. As alluded to above, the number of patterning modules in an optical system grows, the precise alignment of those modules becomes more challenging. More specifically, conventional, manual alignment systems used in projection systems with a small number of projectors immediately become impractical. For example, in a two-projector system, adjustments to a single projector via a manual micro-manipulator are unlikely to interfere with the neighboring projector. This is because the manipulator is un-obstructed from all but one direction.

However, when there is an array of 10-100 micro-projection systems, precision alignment becomes a great technical challenge and obstacle to effective implementation because there is no practical way to adjust one of the micro-projections system within the array manually without causing significant disruptions to the surrounding micro-projection systems.

To eliminate this impediment, disclosed embodiments provide a system with micro-projection patterning modules that utilize wireless communication to transmit data relating to both positional control data and projection data. The technical effect of such transmission of both positional and projection data can be recognized in an example, wherein a large array, e.g., 10-100 projectors; wireless transmission from a centralized controller greatly reduces the number of wires/connection lines necessary to implement positional coordination and supply of projection data for patterning. Although not shown, such a centralized controller may be implemented using one or more computer processors and associated hardware for communicating wirelessly with each of a plurality of projection modules.

In accordance with the disclosed embodiments, each patterning module may be provided with only a single fixed wire to power for operation. Accordingly, all other control, content and operation information may be conveyed from a centralized controller wirelessly to the patterning modules.

Increased flexibility, ease of use and decreased maintenance time result from the highly-modular nature of systems provided in accordance with the disclosed embodiments. If a projector in a single patterning module in a 10×10 projector array (i.e., one of 100 projectors) has a failure, that patterning module can be removed and replaced with an operational patterning module without interfering with the remainder of the projection system.

Additionally, this modularity enables the ability to position projectors into arrays of varying aspect ratios or even non-continuous domains as necessary for a given application. For example, instead of 100 projectors being in a 10×10 array, the array could be in a 1×100 array, a 2×50 array, a 4×25 array, 5×20 array, etc.

As explained above, in accordance with at least some disclosed embodiments, an array of energy patterning (e.g., light patterning) modules may be used in a 3D printing methodology. In SLA 3D printing, the resolution of the x-y plane is often limited by the optical projection system which delivers light/energy to the build interface. The ability to tile multiple projection systems into a large, high-resolution array is often limited by the ability to align multiple micro-projection systems laterally.

To accomplish this, disclosed embodiments utilize a projection module package volume that contains (i) the optical projection components, (ii) a data receiver, and (iii) an electronically controlled micro-positioner; all of which must fit within the footprint of a projected image. For example, for illustrative purposes, consider that, given a 'coarse' resolution of 100 um in conjunction with a 1080p resolution DLP projection module, the cross-section of this projector/manipulator module may be limited to 4.25"×7.5" laterally. If a higher resolution system is desired, such as a common standard of 50 um, this area may decrease to ~2.2"×3.8". Given these small constraints, disclosed embodiments are directed at providing customized modules that fulfill such required resolutions.

FIGS. 1-4 illustrate an example of a patterning module provided in accordance with the disclosed embodiments. Those figures provide various views of a patterning module 100 and its constituent components. As shown in FIGS. 1-4, the patterning module 100 may include a micro-projector 110 which is configured and operates to pattern energy (for example, UV light via DLP). However, it should be understood that the micro-projector 110 may be implemented with one or more lasers operating in conjunction with galvo mirrors or other conventionally known and commercially available or custom patterning/energy systems.

In accordance with at least one disclosed embodiment, the patterning modules 100 disclosed herein may include a micro-projector that is an off-the-shelf model (i.e., conventionally obtainable in an uncustomized state), which is then modified to project Ultra Violet (UV) light (required for photoinitiators used in the SLA printing processes). The patterning module 100 may also include a micro-computer 120, which is wirelessly coupled to, and receives commands from, a host computer (including, for example, positional and projection data) to control positioning and output of energy of the projector 100 to enable patterning for 3D printing processes. Thus, in accordance with at least some disclosed embodiments, the micro-computer 120 may receive commands/data which are sent to the patterning module 100 by the host computer to control energy output (both pattern and intensity) of the projection of the projector 110.

Micro-computer 120 may include any suitable micro-computing device, for example, a micro-computing device defined as an electronic circuit consisting of a processor/microprocessor, CPU, RAM, equipped for external communication (e.g., by wired Ethernet connection, wifi module, NFC, Bluetooth, NIR, optical, and/or any other suitable wired or wireless communications equipment, etc). Exemplary micro-computing devices may falls below the size range of a standard lap-top or desktop computing device. Examples of suitable micro-computing devices may include a Raspberry Pi, an Arduino board, an Intel 'Stick' or 'NUC' computer, or any computing device with comparable volume or smaller to those listed.

Micro-computer 120 and/or host computer may include suitable memory and/or communications circuitry for implementing their discloses operations. Examples of suitable processors may include one or more microprocessors, integrated circuits, system-on-a-chips (SoC), among others. Examples of suitable memory, may include one or more primary storage and/or non-primary storage (e.g., secondary, tertiary, etc. storage); permanent, semi-permanent, and/or temporary storage; and/or memory storage devices including but not limited to hard drives (e.g., magnetic, solid state), optical discs (e.g., CD-ROM, DVD-ROM), RAM (e.g., DRAM, SRAM, DRDRAM), ROM (e.g., PROM, EPROM, EEPROM, Flash EEPROM), volatile, and/or non-volatile memory; among others. Communication circuitry may include components for facilitating processor operations, for example, suitable components may include transmitters, receivers, modulators, demodulator, filters, modems, analog to digital converters, operational amplifiers, and/or integrated circuits.

The patterning module 100 may also include a micro-positioner system 130 driven by a combination of a plurality of stepper motors 140, for example, three stepper motors. The stepper motors could be replaced by other actuating devices, such as pneumatic systems, dc motors, rail systems, etc. Each projector 110 may be mounted to a modified X-Y-Z positioning stage. The axis of these stages may be modified to be manipulated through the coordinated control and operation of the plurality of stepper motors (one for each axis). The micro-positioner 130 may receive commands/data via the micro-computer 120; such commands/data which are used to adjust the location of the patterning module along with the projector within the patterning module 100.

The micro-projector 110, on-board, Wi-Fi enabled micro-computer 120, and micro-positioner components 130, are collectively sized, positioned and function such that the cross-sectional area of the overall patterning module including those components is smaller than the projection field of a single micro-projector.

In accordance with the disclosed embodiments, each patterning module 100 may include a multi-axis, micro-positioning system 130 operating in conjunction with an energy patterning system including a projector 110. More specifically, optomechanical hardware is provided which couples micro-projectors 110 included in patterning modules 100 with electrically driven, multi-axis micro manipulators. When tiled together, these patterning modules 100, and their constituent micro projectors 110, can be aligned to generate a high-resolution optical projection system over an arbitrarily large print bed.

Likewise, each patterning module 100 may contain an on-board micro-computer 120 which is responsible for receiving and distributing commands to the energy patterning system and the micro-positioning system 130 from a remote host (e.g., a centralized, computer implemented controller for the multi-projector system). The communication between the micro-computer 120 and the host may include any one or more of (i) wired and/or wireless communications, (ii) encrypted and/or secured communications, and (iii) unidirectional and/or bi-directional communications. In this way, disclosed embodiments provide a system with micro-projection patterning modules 100 that utilize wireless communication to transmit data relating to both positional control and projection data. The technical effect of such transmission of both positional and projection data can be recognized in an example, wherein a large array, e.g., 10-100 projectors; wireless transmission greatly reduces the number of wires/connection lines necessary to implement positional coordination and supply of projection data for patterning. In some embodiments, wired and wireless communication may be implemented together, for example, with one or more modules 100 communicating with the host computer by wired connection and one or more other modules 100 communicating with the host computer by wireless connection.

The on-board microcomputer 120 is Wi-Fi enabled to receive positional commands, and translates these commands to motor driver instructions for controlling operation of a plurality of stepper motors 140 to cause the actuation and relocation of the projection module 100. Additionally, the on-board microcomputers 120 may be used to receive projection data from the common, remote host, which may be routed to the micro-projector 110 to control the display output.

The communication between the centralized host computer and the patterning modules may be encrypted, e.g., encryption of Scalable Vector Graphics (SVG) strings via algorithms such as AES (symmetric 128-bit encryption cypher) may be sent to each patterning module address to ensure that the proper instructions are sent to each patterning module in an array without risk (or with reduced risk) of tampering. In some embodiments, graphical vector strings may include any suitable form of vector string definition, format, substance, etc., for example, projection data may represented by a series of vectors described in any suitable string format, i.e., non-rasterized image. Likewise, encryption of control and/or feedback data may be performed using cypher keys specific to the overall multi-projector implemented additive manufacturing device itself (this may be implemented, for example, using a MAC address to position library); in this way, the x-y image plane data may be scrambled. Further, encryption may be based upon buffering frequency/speed scrambling the z-image stack data. Scrambling may include misordering data (of the relevant axis) to delinearize the information.

The projection data can be formulated either to enable automated alignment (e.g., projection of positional markers for feed-back control) or to enable projection of a sub-set of a larger 2D image being displayed across the array for the purpose of 3D printing. Thus, in accordance with at least one embodiment, the patterning modules 100 can project a test-pattern at a build interface, which can be utilized for high-resolution alignment (i.e., on the resolution of a single pixel depending on the resolution of an imaging sensor) through use of a feed-back control loop.

Figure 5:
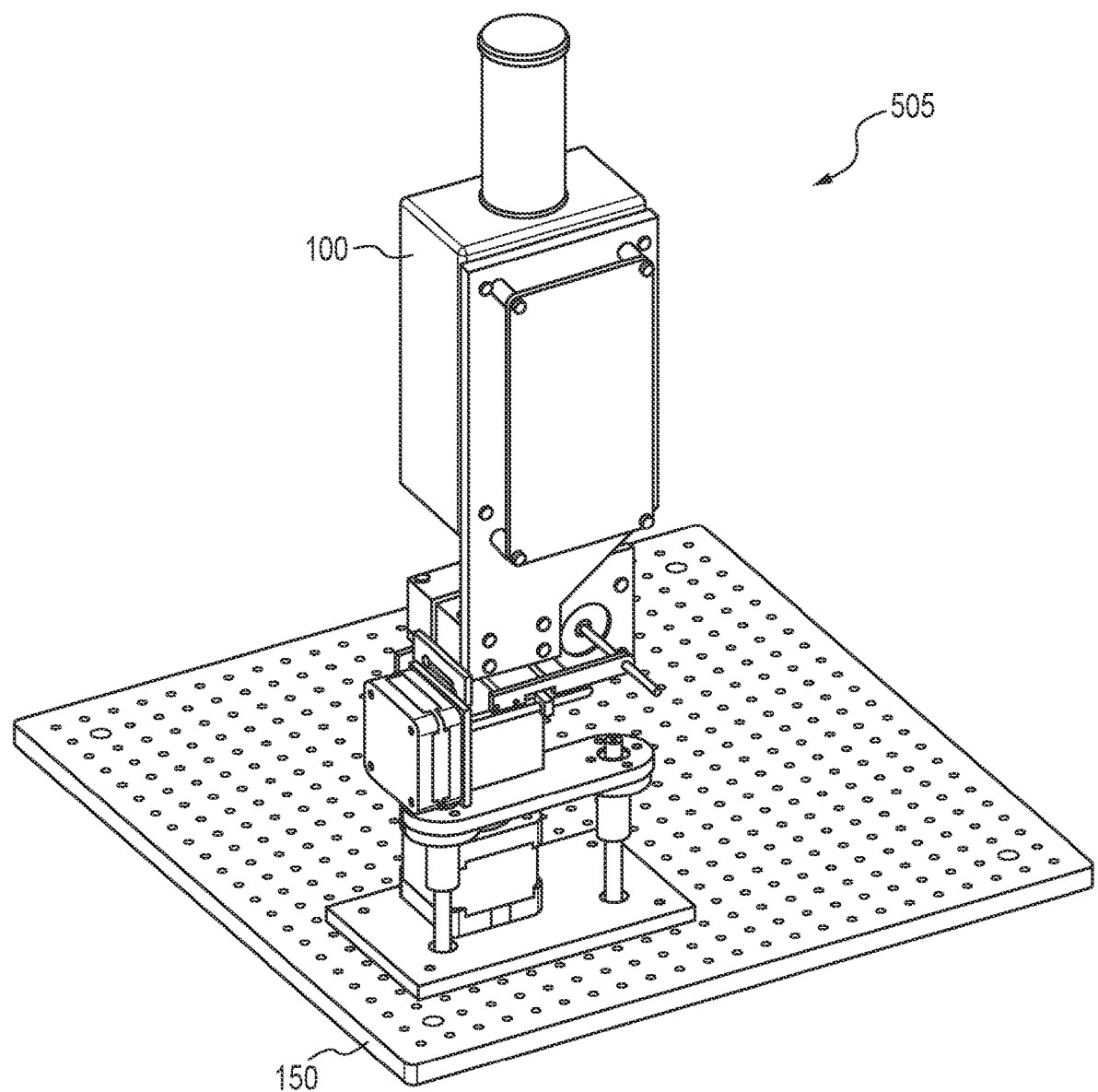
FIGS. 5-6 provide various views of an illustrative example, of a single patterning module mounted to an optical board as well as a 3×3 array of patterning modules (nine in total) mounted on an optical board for comparison and illustration of the exemplary combination of modules that may be used in accordance with disclosed embodiments.
Figure 6:
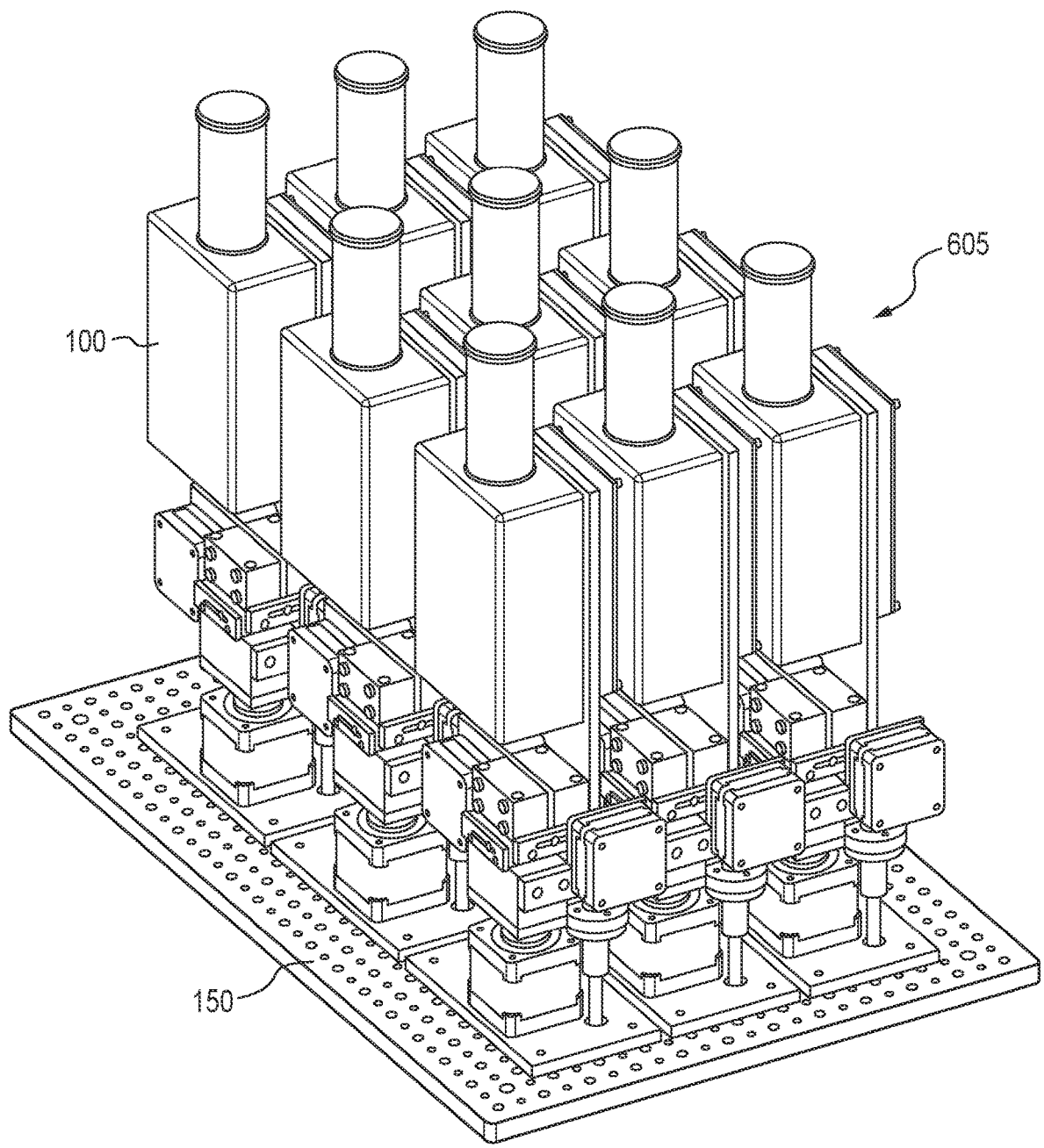

FIG. 5 illustrates an example of a single projector array 505 including a single patterning module 100 mounted to an optical board 150. FIG. 6, illustrates an example of an array 605 of modules 100 arranged in a 3×3 configuration for a total of nine projectors mounted on optical board 150.

Figure 7:
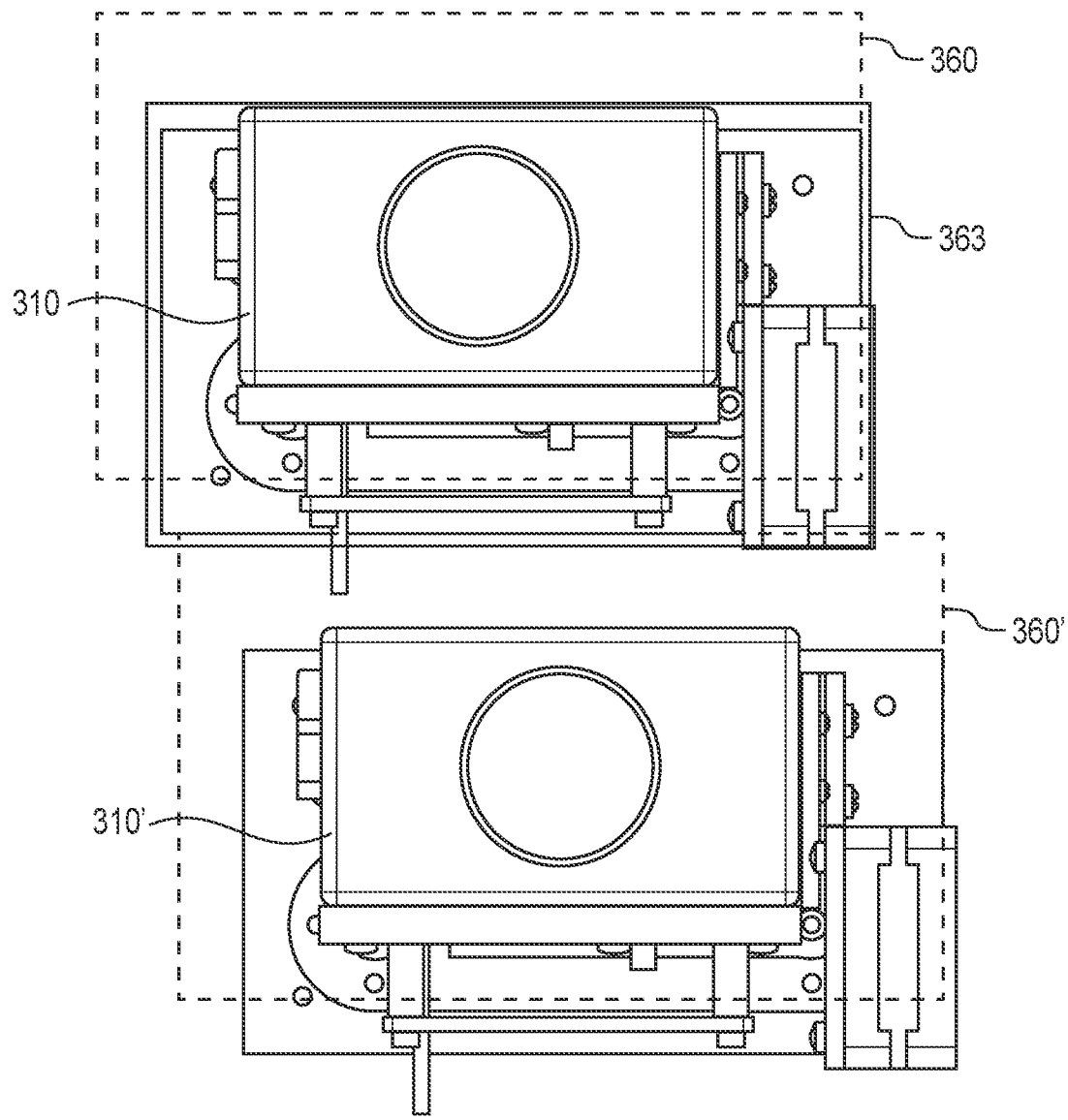
Figure 8:
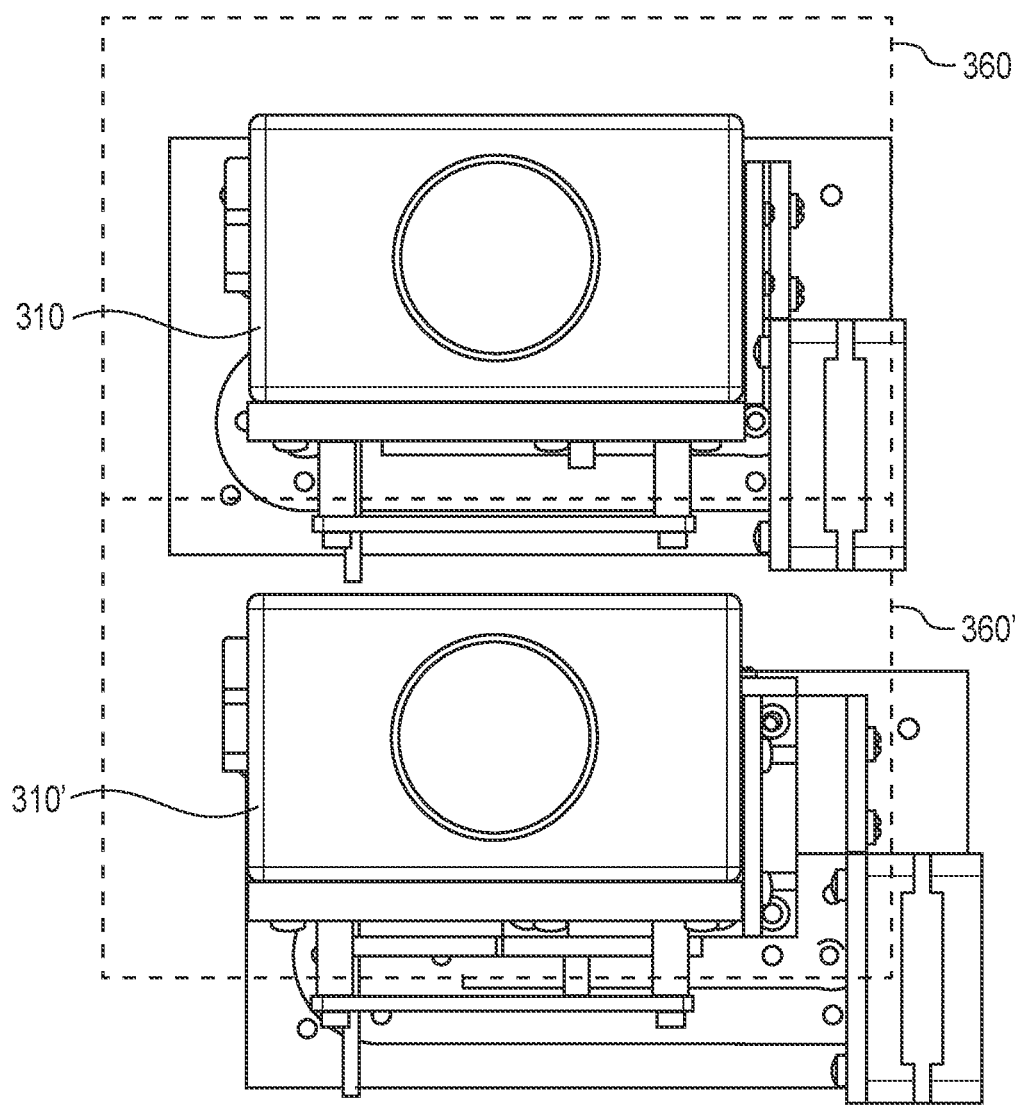

In accordance with at least some disclosed embodiments, the projection system and/or micro-positioner may participate in a feed-back control loop for automated alignment of the energy patterning system to generate a continuous display area. FIGS. 7-8 illustrate an example of alignment operations for the field of view 360, 360' from two separate micro-projectors 310, 310' that are part of separate patterning modules 300, 300' positioned relative to one another on a mounting plate, i.e., optical board. The combined field of view 360, 360' of the micro-projectors 310, 310' represents an applicable display area.

As can be seen in FIG. 7, the mounting of the micro-projectors 310, 310' does not result in perfect alignment. The adjacent edges (longitudinal bottom edge of 360, and longitudinal top edge of 360') of the fields of view 360, 360' are spaced apart from each other. The corresponding lateral edges (right and left edges) of the fields of view 360, 360' are misaligned. In some embodiments, the adjacent fields of view 360, 360' may experience other aspects of misalignment, for example, tilt such that corresponding longitudinal and/or lateral edges are not parallel with each other. To the contrary, as illustrated in FIG. 8, while the positioning of the micro-projectors 310, 310' on the mounting plate illustrated in FIG. 7 remains in the same position as that illustrated in FIG. 7 (that is, out of perfect alignment) the micro-projectors 310 and their resultant field of view 360 may be repositioned in one or more of the x-y-z directions by the micro-positioner systems (such as micro-positioner system 130 using the stepper motors 140 under control of the on-board components illustrated in FIGS. 1-4) to create an aligned and continuous field of view 360, 360' having continuity at the adjacent edges of the fields of view 360, 360'. The example in FIG. 8 shows continuous display by longitudinal edges corresponding exactly in position to eliminate a gap between the fields of view 360, 360' such that the fields of view 360, 360' contact and/or engage each other, and alignment between the corresponding lateral edges; however, in some applications continuous display may not require such alignment of lateral edges, for example, where the applicable footprint of the build subject may be covered by staggered, adjacent fields of view. Similarly, in some applications, continuity of adjacent edges may consider lateral edges contacting and/or engaging each other, and the longitudinal edges may have relative positioning, whether aligned or staggered according to the particular application. In some embodiments, continuous display may not require exact contact of adjacent edges but may include reduction of the spacing between adjacent edges to a threshold spacing, for example, below 1 pixel width; although the threshold spacing may be application specific, for example, within any suitable range of pixel widths from 0.1 to 10 pixels (for descriptive purposes, about 0.001 to about 0.10 inches).

Figure 9:
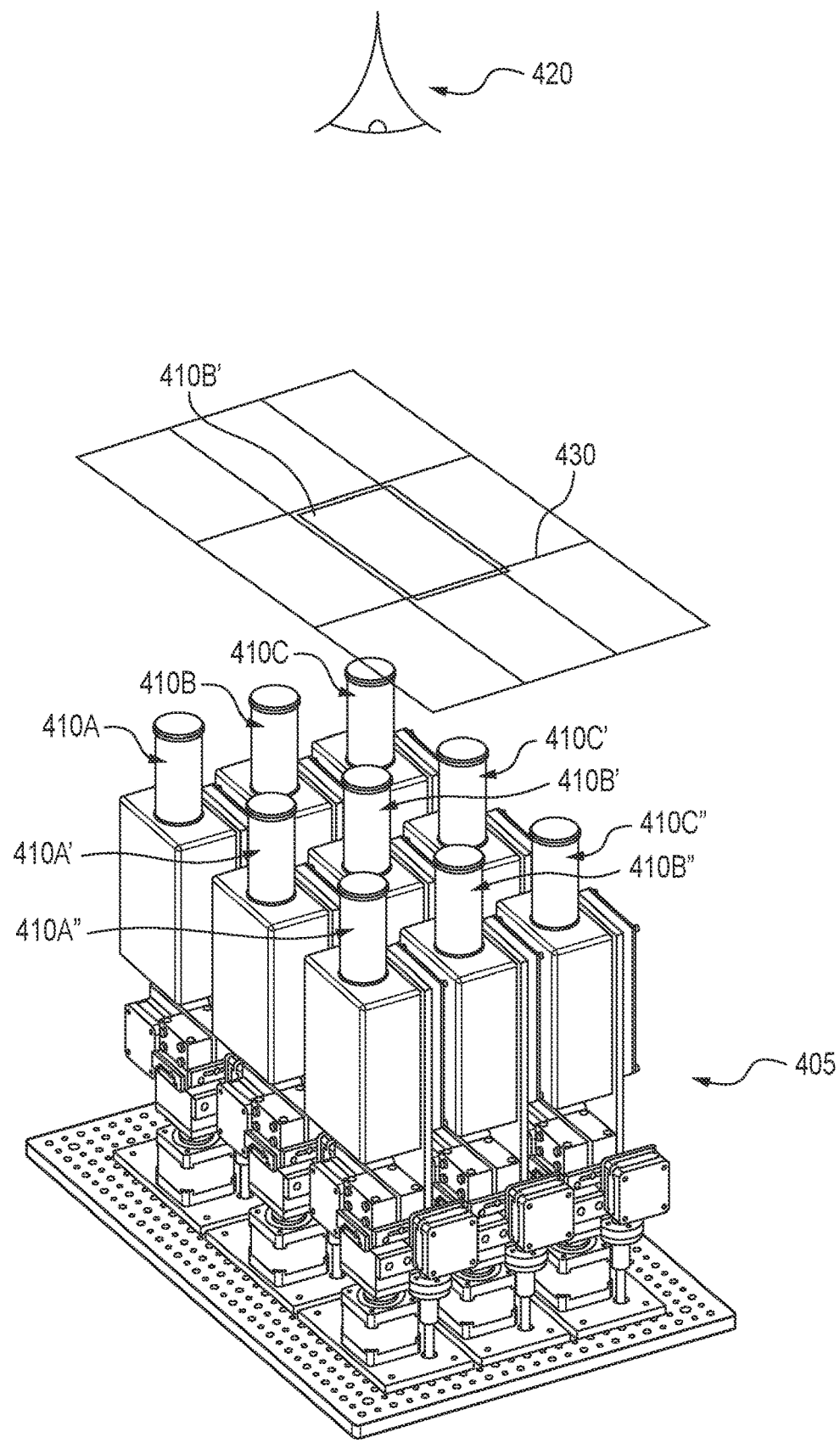
FIGS. 9 and 10 illustrates an example of alignment operations of patterning modules in a 3×3 array in accordance with disclosed embodiments.

Within the present disclosure, the field of view 360 of an individual module 100 is arranged to be larger than a footprint of the module 100. Referring briefly to FIG. 7, the field of view 360 is larger than the footprint 363 of the module 100 in the x-y plane. Likewise the field of view 360' is larger than the footprint of the corresponding module 100 in the x-y plane. Referring briefly to FIG. 9, each field of view of each individual module 100 of the array is larger than the footprint of the corresponding module. In the illustrative embodiment, the collective field of view of the array constituting a display area is larger than the collective footprint of the modules 100 of the array.

Figure 10:
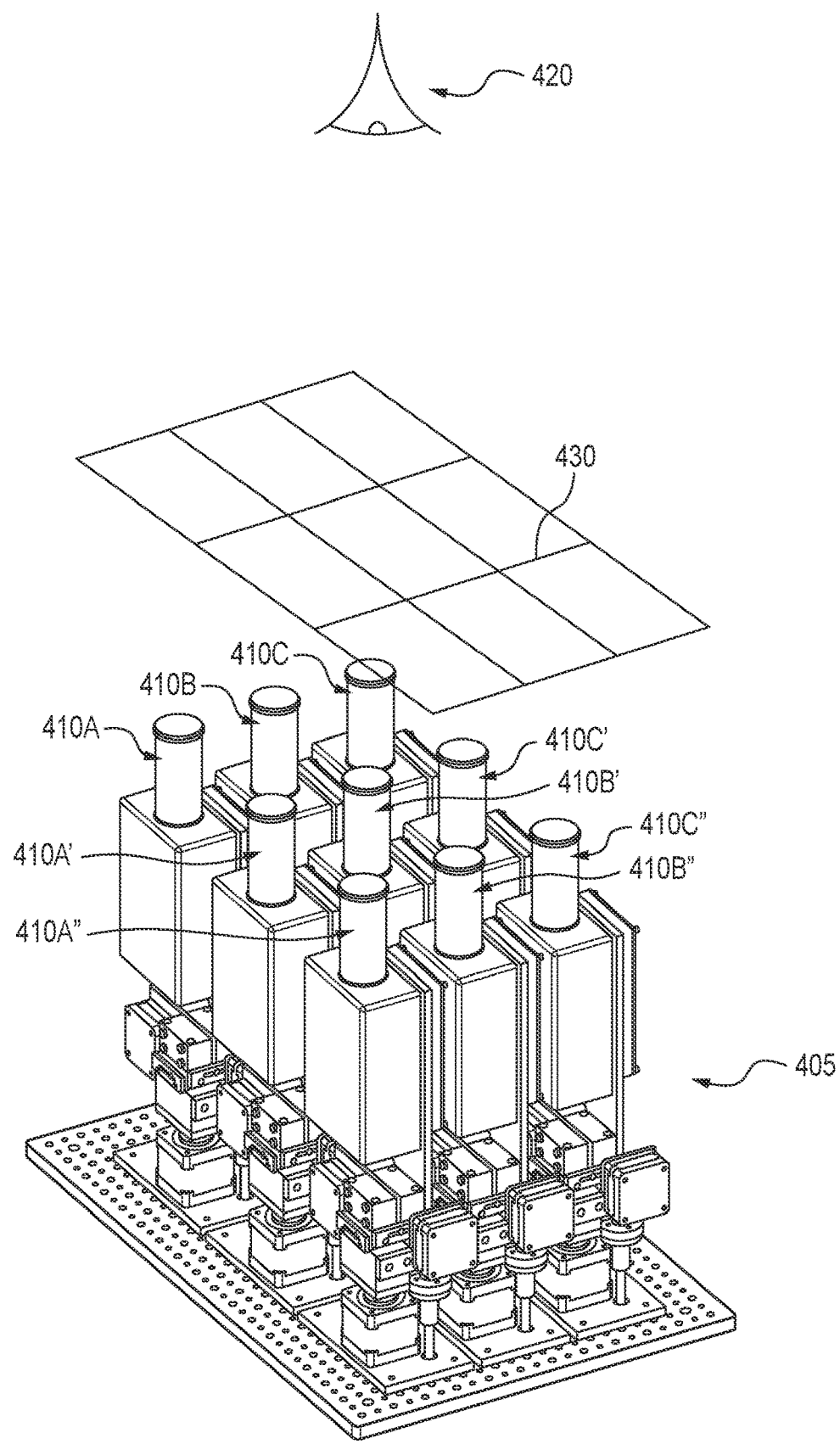

FIGS. 9-10 illustrate an example of a 3D printing system 400, in which an array 405 of a plurality of patterning modules 410A, 410B, 410C, 410A', 410B', 410C', and 410A", 410B", 410C" are aligned (e.g., a 3×3 array of modules). As shown in FIGS. 9-10, an observational sensor 420 is configured to detect mis-alignment of positional indicator markers 430 associated with the fields of view of each of the projectors included in the patterning module array 405.

Based on the relative positioning of these positional indicator markers 430 to their neighbors, the observational sensor 420 of the 3D printing system 400 can detect that a middle projection module 410B' is mis-aligned and must be relocated, as illustrated by the arrow in FIG. 9. A translation may then be performed of the position of the middle projection module 410B' to affect, or perfect, the alignment positioning. FIG. 10 illustrates the resulting alignment after making a x-y plane movement using the micro-positioner and stepper motors illustrated herein.

The observational sensor 420 may also include sensors and associated computational and control software configured to recognize that spacing between positional indicator markers on a single projector (i.e., left and right side of projection field of view) is either too large or small. This may be considered an indication that the patterning module (in this case, having a fixed focal length) is either under or over focused. Based on that indication and its recognition, the computation and control software may make corresponding adjustments in the z-axis for that projector. Observational sensor 420 may include image (e.g., photo, video, thermal, infrared, UV, etc.), positional (e.g., radar, lidar, time-of-flight, etc), and/or other suitable sensor devices.

While certain illustrative embodiments have been described, it is evident that many alternatives, modifications, permutations and variations will become apparent to those skilled in the art in light of the foregoing description. Accordingly, the various embodiments of, as set forth above, are intended to be illustrative, not limiting. Various changes may be made without departing from the spirit and scope of the invention.

For example, as explained above, in accordance with disclosed embodiments. modularity enables the ability to position projectors into arrays of varying aspect ratios or even non-continuous domains as necessary for a given application, e.g., 100 projectors being in a 10×10 array. Alternatively, if a large diameter tubular structure is desired, one potentially optimal arrangement of projectors may cover the footprint of an annulus in which there is a discontinuity in the center, thus requiring no patterning modules in that location, as illustrated in FIG. 11-12.

Figure 11:
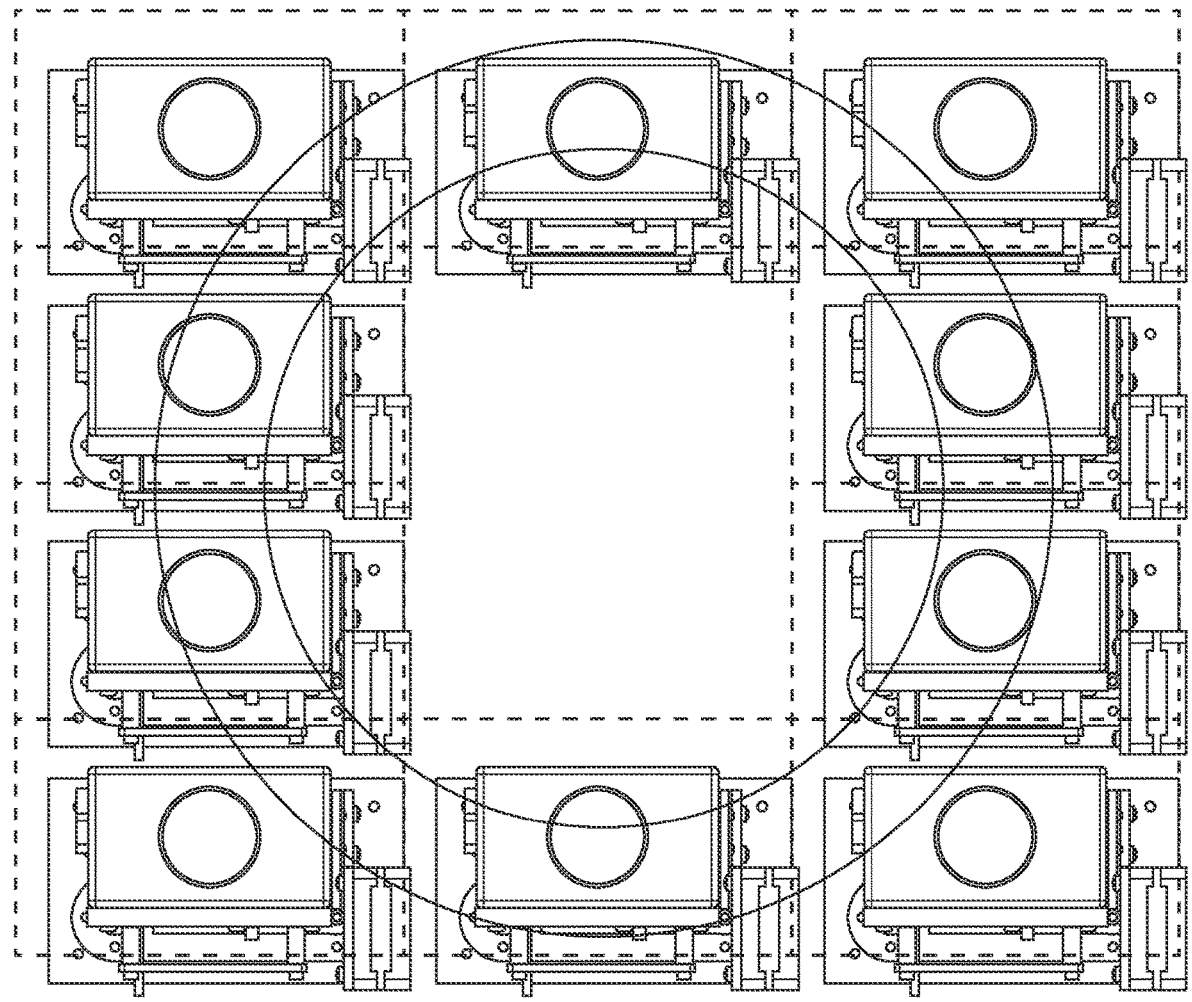
FIG. 11 illustrates a top-down depiction of optical modules with aligned fields-of-view in accordance with at least one disclosed embodiment for printing a large diameter gasket.

FIG. 11 illustrates a top-down depiction of optical modules with aligned fields-of-view (represented by black dashed lines). The desired object has a profile of an annulus, represented by the curved shading. This enables for the printing of this object with less optical module units, e.g., using 10 instead of 12 in a continuous array. These savings become larger when such a structure becomes larger. Thus, in implementation such an embodiment has particular technical utility in a scenario wherein the desire is to print a 3 foot outer-diameter gasket. It should be understood, in that scenario, for such an embodiment implementation, the annuls would not need optical modules within its inner diameter to be printed.

Figure 12:
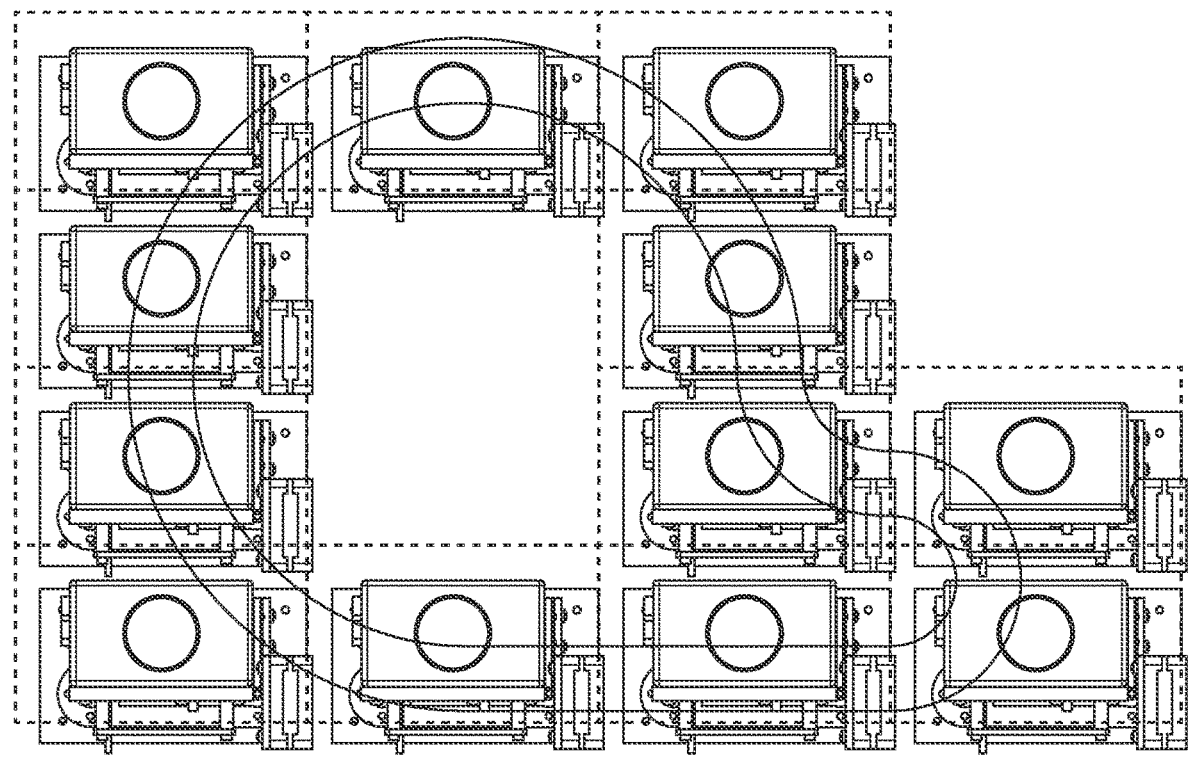
FIG. 12 illustrates another top-down depiction of optical modules with aligned fields-of-view in accordance with at least one disclosed embodiment for printing a large diameter gasket.

FIG. 12 illustrates a top-down depiction of optical modules with aligned fields-of-view (again represented by black dashed lines). In FIG. 12, the 2-D projection of the desired object, again represented by curved shading, does not require a full array of 16 optical modules (i.e., 4×4). Again, in implementation such an embodiment has particular technical utility in a scenario wherein the desire is to print a large, non-circular gasket. It should be understood, in that scenario, for such an embodiment implementation, it is possible to use 75% of the projection modules that would otherwise be required; in doing so, this implementation drastically reduces the cost to manufacture the 3D printer for this particular use.

It should be understood that the proposed method and the associated devices can be implemented in various forms of hardware, software, firmware, special processors or a combination thereof. Both the equipment disclosed herein as part of the projection modules and the remote, centralized controller host may be implemented accordingly. Thus, special processors may comprise Application-Specific Integrated Circuits (ASICs), Reduced Instruction Set Computers (RISC) and/or Field Programmable Gate Arrays (FPGAs). Accordingly, the presently disclosed multi-projector implemented additive manufacturing device and its associated functionality may be implemented as a combination of hardware and software. The software may be installed as an application program on a program storage device. This typically involves a machine based on a computer platform which has hardware, such as, for example, one or more central units (CPU), a random-access memory (RAM) and one or more input/output (I/O) interfaces. Furthermore, an operating system is typically installed on the computer platform. The different processes and functions that have been described here may form part of the application program, or a part which is run via the operating system.

Thus, in accordance with disclosed embodiments, a patterning module may be provided for use in an additive manufacturing device as part of an array of patterning modules under common control by a device controller that is remote to the patterning module array, wherein the patterning module includes a micro-projector configured to project energy for performing energy patterning based on data received from the remote controller for the device, wherein positioning of the microprojector is controlled relative to micro-projectors included in other patterning modules within the patterning module array based on the received data.

In accordance with those disclosed embodiments, the patterning module may optionally include a micro-computer coupled to the micro-projector which receives the data from the remote controller for the device for emitting energy via the micro-projector to control the micro-projector to emit energy based on the received instructions.

In accordance with those disclosed embodiments, the patterning module may optionally include the multi-axis, micro-positioning system coupled to the micro-computer and configured to control positioning of the micro-projector relative to micro-projectors included in other patterning modules within the patterning module array, wherein the micro-positioning system includes a plurality of actuators operated based on the data provided by the micro-positioning system, wherein such data are based on data received by the micro-positioning system from the remote device controller optionally via the micro-computer.

Likewise, in accordance with some disclosed embodiments, a patterning module for use in an additive manufacturing device as part of an array of patterning modules under common control by a device controller that is remote to the patterning module array is provided, wherein the patterning module includes a micro-projector configured to project energy for performing energy patterning, and a multi-axis, micro-positioning system to control positioning of the micro-projector relative to micro-projectors included in other patterning modules within the patterning module array, wherein the micro-positioning system includes a plurality of actuators operated based on data provided by the remote device controller.

In accordance with those disclosed embodiments, the patterning module may optionally include a micro-computer coupled to the micro-projector and/or multi-axis, micro-positioning system which relays data received by the remote device controller to either the micro-projector or multi-axis micro-positioning system.

Moreover, in accordance with each of those disclosed embodiments, the data between the micro-computer and remote device controller are encrypted. For example, this may involve encryption of SVG strings sent to an address associated with the patterning module, wherein the encryption is optionally performed by applying a symmetric encryption cypher, encryption performed by applying one or more cypher keys or tokens specific to the additive manufacturing device, and/or encryption that scrambles x-y image plane data and encrypted data based upon buffering frequency/speed, thereby scrambling the z-image stack data.

Further, in accordance with each of those disclosed embodiments, the multi-axis, micro-positioning system may automatically control positioning of the micro-projector relative to micro-projectors included in other patterning modules within the patterning module array so as to automatically align fields-of-view for the micro-projectors of the patterning module array to generate a continuous display area.

Additionally, in accordance with each of those disclosed embodiments, a sensory element collects data used to determine the relative location of the patterning modules to provide alignment of the field of view of the micro-projector with a micro-projector of at least one other patterning module in the array.

Further, in accordance with each of those disclosed embodiments, the control of the multi-axis, micro-positioning system may optionally be performed using a feed-back loop that includes the micro-projector and/or the micro-positioner.

Moreover, in accordance with each of those disclosed embodiments, the data received by micro-computer from the remote controller may include positional commands for the multi-axis micropositioner and/or a data set to be projected by the micro-projector.

Figure 13:
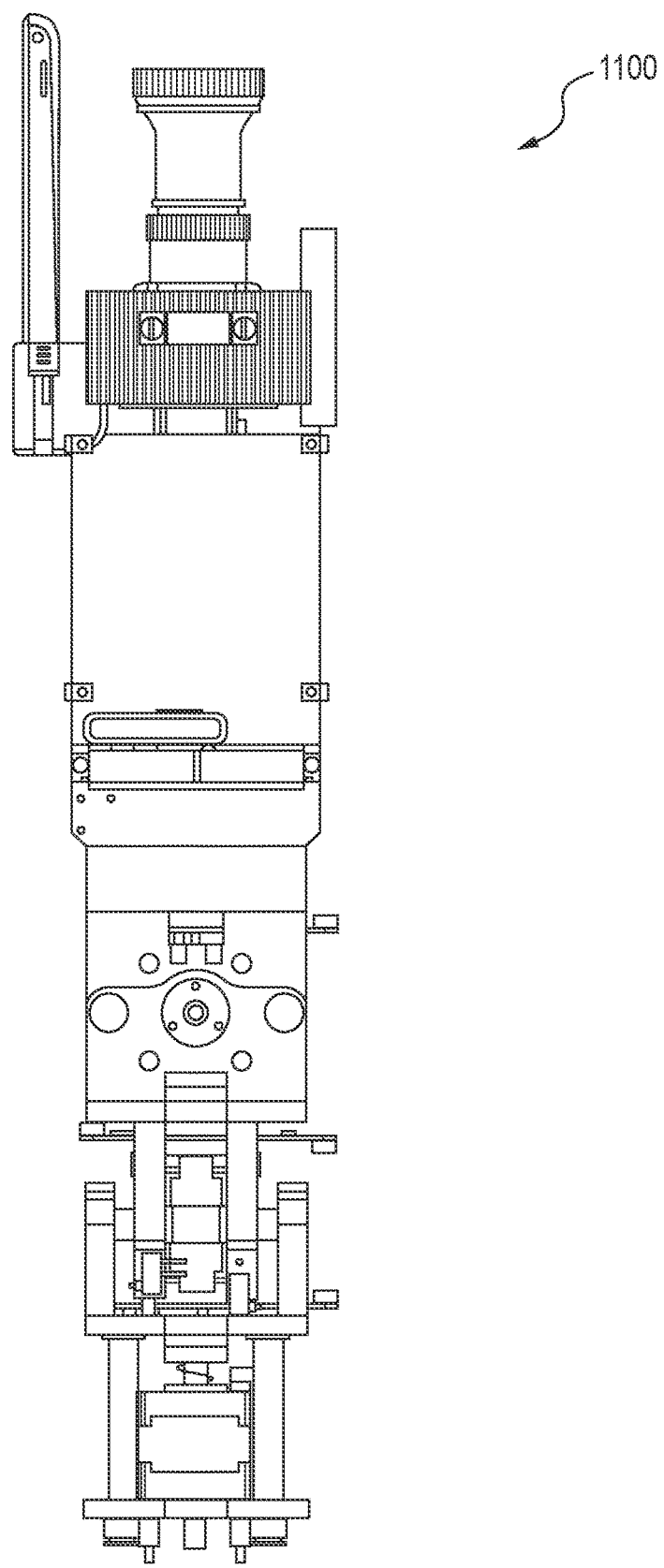
FIGS. 13-17 illustrate views of another optical modules in accordance with the present disclosure.
Figure 14:
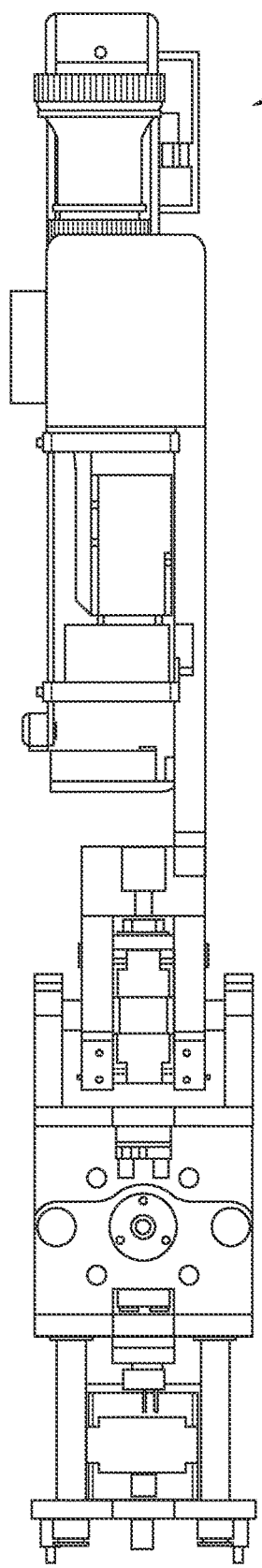
Figure 15:
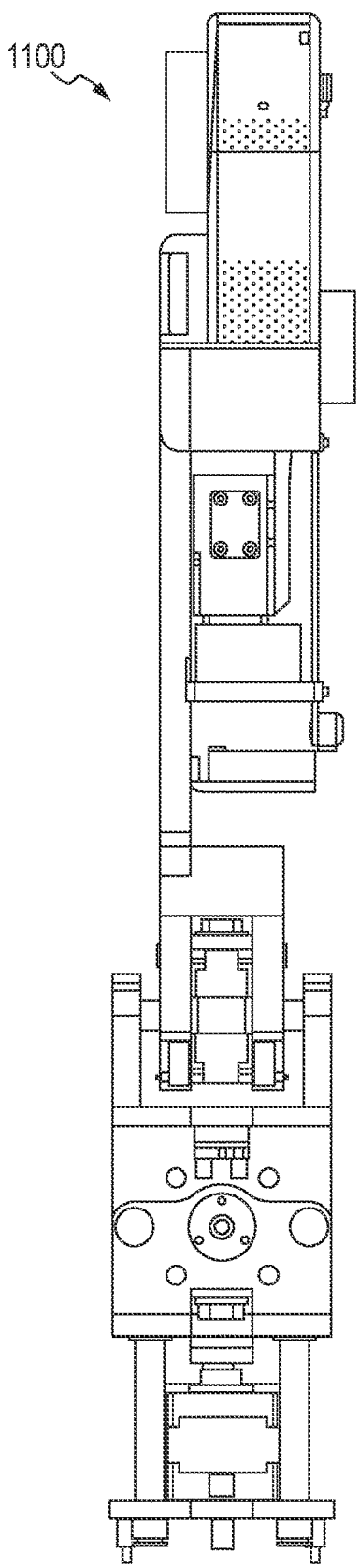
Figure 16:
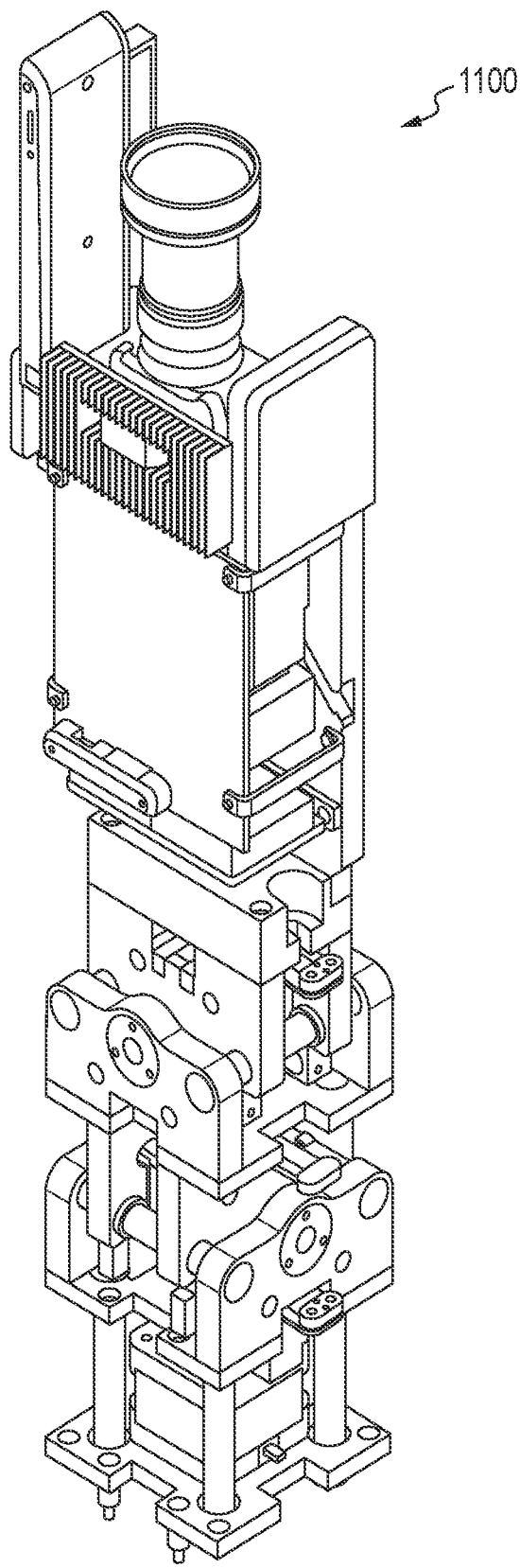
Figure 17:
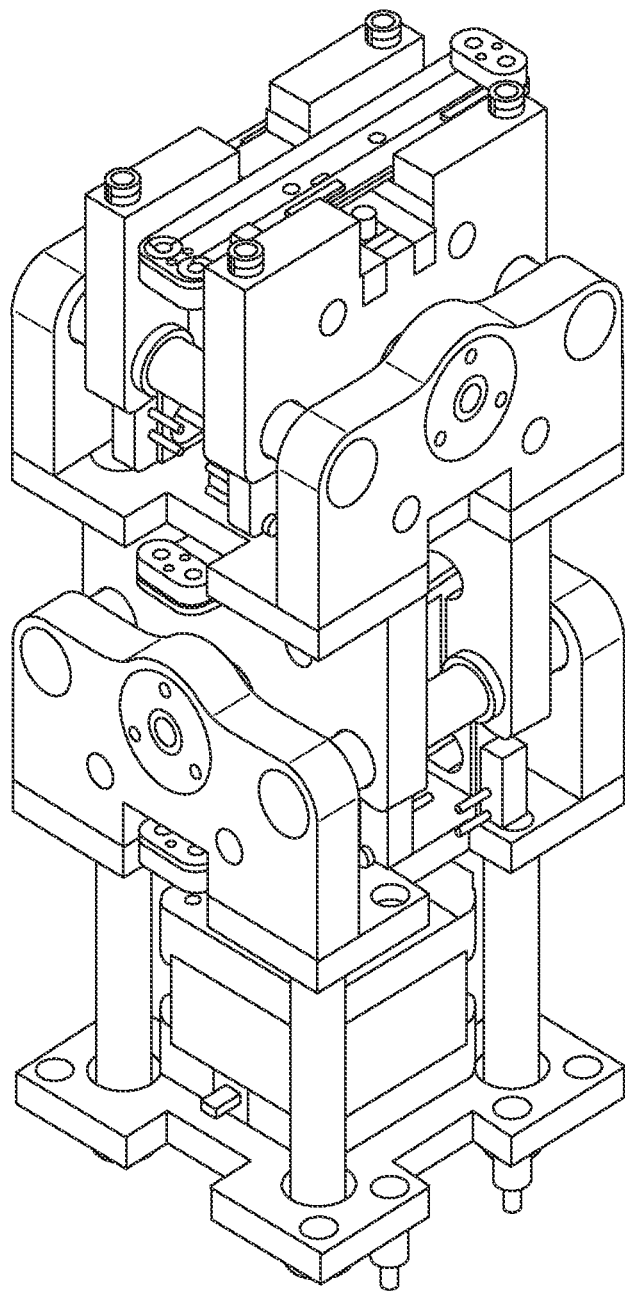

Referring now to FIGS. 13-18, an additive manufacturing device and/or system is shown similar to that already discussed above, and the disclosure of devices, systems, and methods mentioned above are equally applicable to the devices, systems, and methods discussed hereafter. In FIG. 13, a patterning module 1100 is shown including a micro-projector, micro-computer, and actuators (x, y, and z) comprising stepper motors for driving precision motion of the positions of the micro-projector. Referring to FIGS. 14 and 15, the stepper motors are arranged to translate the frame supports of the module along guide rails that are oriented along the corresponding x, y, and z axes to position the micro-projector. Limit switches may be provided to guide operational control of the stepper motors by the micro-computer according to the remote host computer. Referring now to FIG. 16, each module 1000 illustratively includes one or more control boards 1112 for actuation of the actuators. The control boards 1112 may be operated under guidance of the micro-computer.

Figure 18:
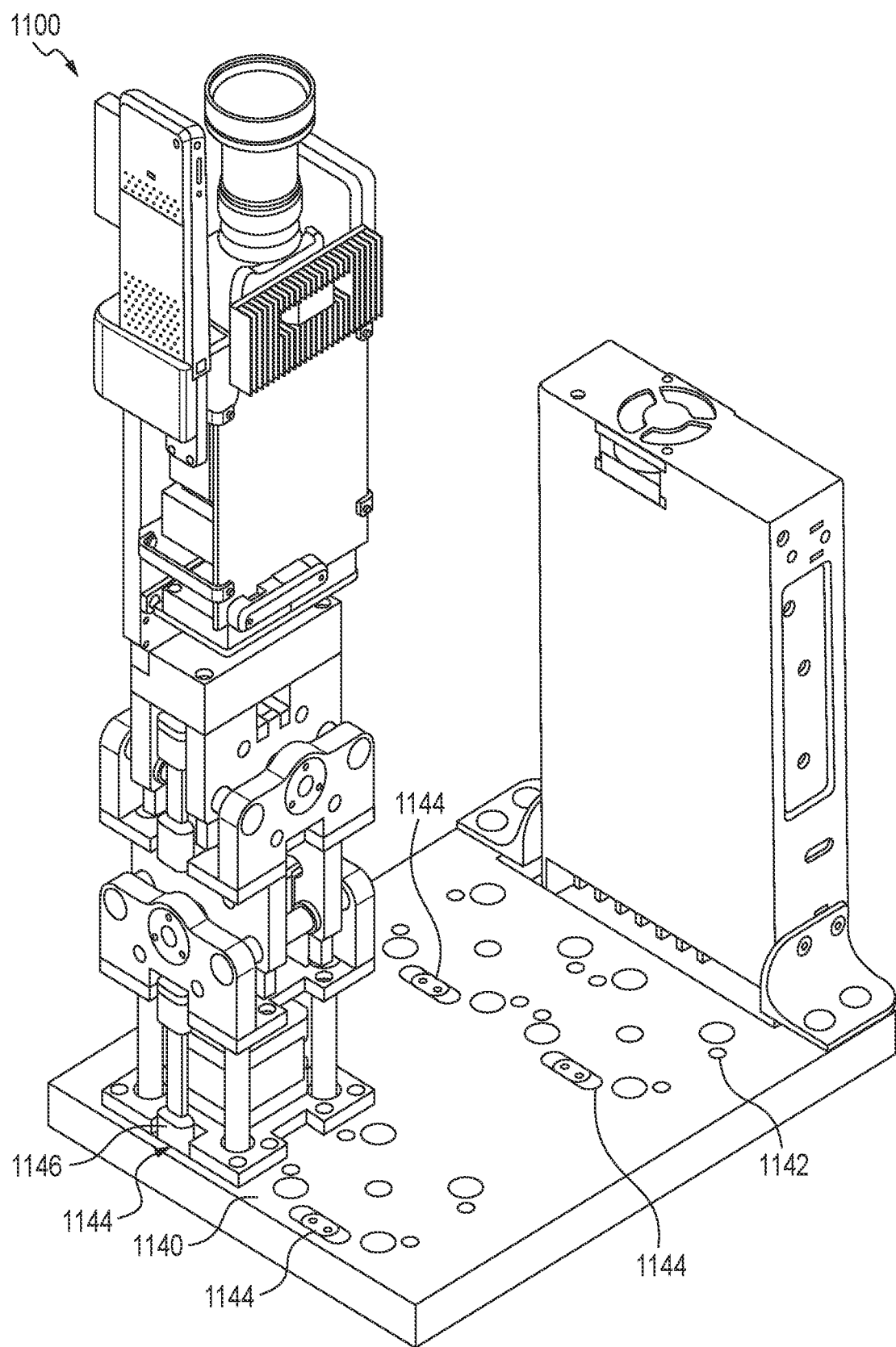
FIG. 18 illustrates a perspective view of an additive manufacturing system including a base mount having the optical module of FIGS. 13-17 mounted thereon.
Figure 19:
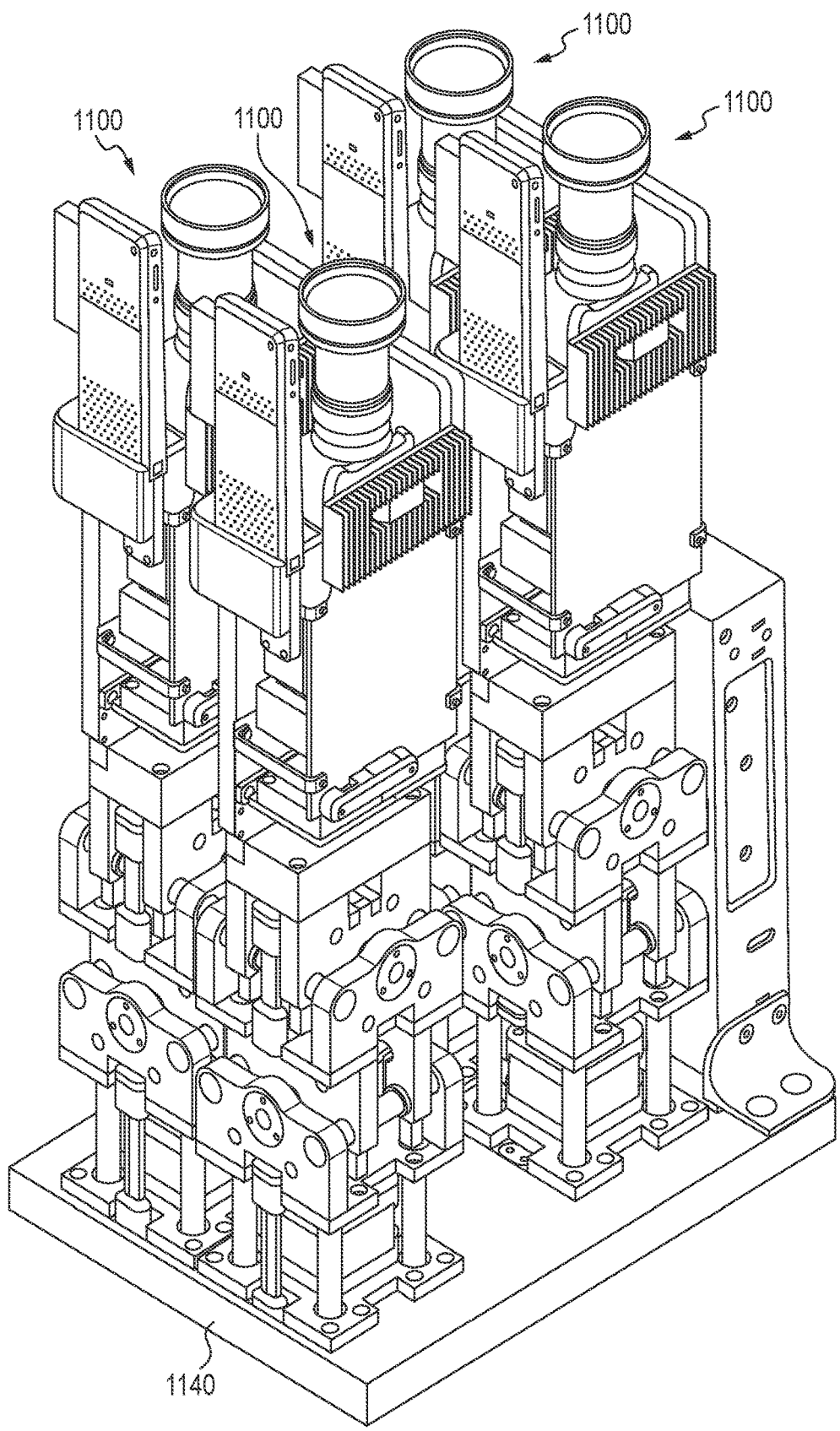
FIG. 19 illustrates a perspective view of the additive manufacturing system of FIG. 18 showing the base mount having a plurality of optical modules of FIGS. 13-17 mounted thereon.

Referring now to FIGS. 18 and 19, the additive manufacturing system is shown to include a base mount 1140. The base mount 1140 is illustratively embodied as a mounting plate for receiving connection of the patterning modules 1100. The base mount 1140 is illustratively formed as a structural member providing support for load bearing operation of the actuators while accommodating selective arrangement of the modules 1100 for mounting. As shown in FIG. 18, the patterning module 1100 is shown having one (longitudinal) end mounted to the base mount 1140. The one end of the module 1100 mounted to the base mount 1140 is illustratively opposite the end having the micro-projector. The base mount 1140 illustratively includes guides 1142 illustratively embodied as alignment pins for insertion within alignment holes within the mounted patterning module 1100 to assist in proper mounting. In some embodiments, arrangement of one or more alignment pins may be formed on the modules 1100 and the corresponding one or more alignment holes on the base mount 1140. The base mount 1140 illustratively includes connectors 1144. Connectors 1144 are illustratively embodied to provide wired electrical communication between the host computer and the micro-computer of the pattern module 1100. In the illustrative embodiment, the connectors 1144 provide electrical connection for electrical power and data communication. In some embodiments, the connectors 1144 may be configured to provide wired electrical power, and data may be communicated wirelessly with the modules 1100. The patterning module 1100 is connected with the corresponding connector 1144 via a matching connector 1146 of the patterning module 1100. Power supply circuitry may be mounted on the base mount 1140.

Referring now to FIG. 19, four patterning modules 1140 are shown mounted to the base mount 1140. Each patterning module 1140 is arranged in communication with the corresponding connector 1144 via its matching connector 1146. Accordingly, a modular array can be formed with selectively arrangeable modules 1140 that can be easily connected and disconnected for mounting in a variety of positions to provide the display area suitable for the build project.

Within the present disclosure, a patterning module for an additive manufacturing system as part of an array of patterning modules under common control by a controller that is remote to the array of patterning modules, may include a micro-projector configured to project energy for performing energy patterning for additive manufacturing; and a multi-axis micro-positioning system to control positioning of the micro-projector relative to micro-projectors of other patterning modules within the array of patterning modules. The micro-positioning system may include a plurality of actuators operated based on patterning data provided by the remote controller.

In some embodiments, the multi-axis micro-positioning system may implement positioning of the micro-projector relative to micro-projectors of other patterning modules of the array to align fields-of-view for the micro-projectors of the array to generate a continuous display area. The multi-axis micro-positioning system may implement positioning of the micro-projector according to automated control commands from the remote controller to automatically align a field-of-view of the micro-projector with at least one field-of-view of the other patterning modules of the array.

In some embodiments, the remote controller may be arranged in communication with at least one sensor for collecting data to determine a relative position of one or more of the other patterning modules for aligning the field of view of the micro-projector with the micro-projector of at least one other patterning module of the array. Automated control commands for the multi-axis micro-positioning system may be generated by the remote controller using feed-back control information considering at least one of the micro-projector and the micro-positioning system. Although in some embodiments, any suitable manner of control scheme may be applied including derivative, feed forward controls, and/or combinations thereof.

In some embodiments, the patterning module may further include a micro-computer. The micro-computer may be arranged in communication with at least one of the micro-projector and the multi-axis micro-positioning system. The micro-computer may be arranged for receiving control commands including the patterning data from the remote controller for controlling operation of at least one of the micro-projector and the multi-axis micro-positioning system.

In some embodiments, the patterning data received by micro-computer from the remote controller may include positional commands for the multi-axis micropositioner. The patterning data may includes a projection data set to be projected by the micro-projector for additive manufacturing. The patterning data may include synchronization data for synchronizing the timing of the modules of the array. For example, the synchronization data may include a clock signal and/or may be formed digitally and/or by analog signal.

In some embodiments, communications between the micro-computer and remote controller may be encrypted. Encryption of the communications between the micro-computer and the remote controller may include encryption of vector strings sent to an address associated with the patterning module. Encryption may include application of symmetric encryption cypher. In some embodiments, encryption may include application of cypher keys and/or tokens specific to the additive manufacturing system. Encryption may include scrambling of at least one of x-y image plane data and z-image stack based upon at least one of data buffering frequency and data transmission speeds.

Within the present disclosure, an additive manufacturing device may include a device controller; and an array of patterning modules under common control of the device controller, wherein the device controller is arranged remote relative to the patterning module array. By being remote, the device controller may be nearby but distinct from the modules to allow preferable physical arrangement of the modules, while having central control. In some embodiments, each of the patterning modules within the array may include a micro-projector configured to project energy for performing energy patterning for additive manufacturing. One or more of the patterning modules may include a multi-axis micro-positioning system to control positioning of the micro-projector relative to micro-projectors of other patterning modules of the array of patterning modules. The one or more micro-positioning systems may include a plurality of actuators operated based on patterning data provided by the device controller.

In some embodiments, each patterning module may further include a micro-computer in communication with at least one of the corresponding micro-projector and multi-axis micro-positioning system. Each micro-computer may be arranged for receiving control commands including the patterning data from the remote controller for controlling operation of at least one of the corresponding micro-projector and multi-axis micro-positioning system.

In some embodiments, the multi-axis micro-positioning system may implement positioning of one or more of the micro-projectors relative to at least one micro-projector of other patterning modules of the array to align fields-of-view for the micro-projectors of the array to generate a continuous display area. The multi-axis micro-positioning system may implement positioning of the one or more micro-projectors according to automated control commands from the remote controller to automatically align fields-of-view for the micro-projectors of the array.

In some embodiments, the additive manufacturing device may further comprising at least one sensor for collecting data. The at least one sensor may be arranged in communication with the device controller for determining relative location of one or more of the patterning modules for aligning one or more fields-of-view of the micro-projectors of the array.

In some embodiments, automated control commands for the multi-axis micro-positioning system may be generated by the remote controller. The remote control may generate automated control commands using feed-back control information considering at least one of the micro-projector and the micro-positioning system. Although in some embodiments, any suitable control manner may be implemented including derivative, feed-forward, and/or combinations thereof.

In some embodiments, the patterning data received by at least one micro-computer from the remote controller may include positional commands for the multi-axis microposititioner. The patterning data may include a projection data set to be projected by the micro-projector. The patterning data may include synchronization data for synchronizing projection between different modules of the array.

In some embodiments, the communications between one or more of the micro-computers and remote device controller may be encrypted. Encryption may include encryption of vector strings sent to an address associated with the patterning module. Encryption may include application of symmetric encryption cypher. Encryption may include application of cypher keys and/or tokens specific to the additive manufacturing system. Encryption may include scrambling of at least one of x-y image plane data and z-image stack based upon at least one of data buffering frequency and data transmission speeds.

In some embodiments, the additive manufacturing device may further include a base mount configured to receive mounting of one or more patterning modules of the array. The base mount may include a number of connection ports to provide power and/or communication. Each connection port may be configured for communication with one of the patterning modules mounted on the base mount to provide communication with the remote controller to provide power and/or communication.

Within the present disclosure, a method of performing additive manufacturing may include controlling emission of projected energy by an array of a plurality of patterning modules by a device controller. The device control may be remote to the patterning module array. Each of the patterning modules within the array may include a micro-projector configured to project energy for performing energy patterning. The method may include controlling positioning of the micro-projector relative to micro-projectors included in other patterning modules within the patterning module array using a multi-axis, micro-positioning system, wherein the micro-positioning system includes a plurality of actuators operated based on instructions provided by the remote device controller.

In some embodiments, the method may further comprise relaying data received from the remote device controller by a micro-computer coupled to the micro-projector and/or the multi-axis, micro-positioning system to either the micro-projector or multi-axis micro-positioning system. In some embodiments, the method may further comprise encrypting the data sent between the micro-computer and remote device controller. In some embodiments, the multi-axis, micro-positioning system may automatically controls positioning of the micro-projector relative to micro-projectors included in other patterning modules within the patterning module array so as to automatically align fields-of-view for the micro-projectors of the patterning module array to generate a continuous display area.

In some embodiments, the method may further comprise collecting data using a sensory element to determine the relative location of the patterning modules to provide alignment of the field of view of the micro-projector with a micro-projector of at least one other patterning module in the array. In some embodiments, control of the multi-axis, micro-positioning system may be performed using a feed-back loop that includes the micro-projector and/or the micro-positioner.

The disclosure is not limited to the example embodiments described here. There is scope for various adaptations and modifications which the person skilled in the art, due to his technical knowledge, would also consider as belonging to the disclosure.

We claim:

1. A method of performing additive manufacturing, the method comprising:
controlling emission of projected energy by an array of a plurality of patterning modules by a device controller that is remote to the patterning module array to initiate solidification of a polymerizable material, wherein each of the patterning modules within the array includes a micro-projector configured to project energy for performing energy patterning and a micro-computer comprising a microprocessor having data memory storage capabilities;

controlling positioning of each micro-projector relative to micro-projectors included in other patterning modules within the patterning module array using a multi-axis, micro-positioning system, wherein the micro-positioning system includes a plurality of actuators operated based on the corresponding micro-computer's use of positional data provided by the remote device controller for storage by the corresponding microprocessor; and controlling patterned energy projection by each micro-projector relative to the micro-projectors included in other patterning modules within the patterning module array to solidify successive layers of polymerizable material based on the corresponding micro-computer's use of projection data provided by the remote device controller for storage by the corresponding microprocessor, wherein controlling of the positioning and the projection of each micro-projector of the patterning module within the patterning module array is synchronized with the positioning and projection of other patterning modules within the patterning module array based on the corresponding micro-computer's use of synchronization data provided by the remote device controller for storage by the corresponding microprocessor of the patterning module.

2. The method of claim 1, further comprising sending at least one of the positional data, patterning data, and synchronization data from the remote device controller for storage by the corresponding micro-computer.

3. The method of claim 2, further comprising encrypting the data sent between the micro-computer and remote device controller.

4. The method of claim 1, wherein the multi-axis, micro-positioning system automatically controls positioning of the micro-projector relative to micro-projectors included in other patterning modules within the patterning module array so as to automatically align fields-of-view for the micro-projectors of the patterning module array to generate a continuous display area.

5. The method of claim 4, further comprising collecting data using a sensory element to determine the relative location of the patterning modules to provide alignment of the field of view of the micro-projector with a micro-projector of at least one other patterning module in the array.

6. The method of claim 4, wherein the control of the multi-axis, micro-positioning system is performed using a feed-back loop that includes the micro-projector and/or the micro-positioner.

7. An additive manufacturing system comprising:
a controller; and
an array of patterning modules including at least one patterning module as part of the array of patterning modules under remote control by the controller remote to the array of patterning modules, the patterning module comprising:
a micro-projector configured to project energy for performing energy patterning for additive manufacturing;
a micro-computer comprising a micro-processor having data memory storage capabilities, wherein the micro-computer is configured to receive patterning data in the form of at least one of positional data, patterning data, and synchronization data from the remote controller for storage; and
a multi-axis micro-positioning system to control positioning of the micro-projector relative to micro-projectors of other patterning modules within the array of patterning modules, wherein the micro-positioning system includes a plurality of actuators operated based on positional data received by the micro-computer from the remote controller.

8. The additive manufacturing system of claim 7, wherein the multi-axis micro-positioning system implements positioning of the micro-projector relative to micro-projectors of other patterning modules of the array to align fields-of-view for the micro-projectors of the array to generate a continuous display area.

9. The additive manufacturing system of claim 8, wherein the multi-axis micro-positioning system implements positioning of the micro-projector according to automated control commands from the remote controller to automatically align a field-of-view of the micro-projector with at least one field-of-view of the other patterning modules of the array.

10. The additive manufacturing system of claim 9, wherein the remote controller is arranged in communication with at least one sensor for collecting data to determine a relative position of one or more of the other patterning modules for aligning the field of view of the micro-projector with the micro-projector of at least one other patterning module of the array.

11. The additive manufacturing system of claim 9, wherein automated control commands for the multi-axis micro-positioning system are generated by the remote controller using feed-back control information considering at least one of the micro-projector and the micro-positioning system.

12. The additive manufacturing system of claim 7, wherein the positional data received by micro-computer from the remote controller includes positional commands for the multi-axis micropositioner.

13. The additive manufacturing system of claim 7, wherein said at least one of positional data, projection data, and synchronization data includes patterning data received by micro-computer from the remote controller and said projection data includes a projection data set to be projected by the micro-projector for additive manufacturing.

14. The additive manufacturing system of claim 7, wherein communications between the micro-computer and remote controller are encrypted.

15. The additive manufacturing system of claim 14, wherein encryption of the communications between the micro-computer and the remote controller includes encryption of vector strings sent to an address associated with the patterning module.

16. The additive manufacturing system of claim 15, wherein encryption includes application of symmetric encryption cypher.

17. The additive manufacturing system of claim 14, wherein encryption includes application of one or more of cypher keys and token specific to the additive manufacturing system.

18. The additive manufacturing system of claim 14, wherein encryption includes scrambling of at least one of x-y image plane data and z-image stack based upon at least one of data buffering frequency and data transmission speeds.

19. The additive manufacturing system of claim 7, wherein said at least one of positional data, projection data, and synchronization data includes synchronization data received by micro-computer from the remote controller and said synchronization data includes data for synchronizing projection between different patterning modules of the array.

20. The additive manufacturing system of claim 7, wherein the field of view of the at least one patterning module is larger than a footprint of the at least one patterning module.

* * * * *